(12) United States Patent
Suzuki et al.

(10) Patent No.: US 11,658,047 B2
(45) Date of Patent: May 23, 2023

(54) EXHAUST NOZZLE UNIT, LOAD PORT, AND EFEM

(71) Applicant: Sinfonia Technology Co., Ltd., Tokyo (JP)

(72) Inventors: Atsushi Suzuki, Tokyo (JP); Yasushi Taniyama, Tokyo (JP); Tomoya Mizutani, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 721 days.

(21) Appl. No.: 16/387,792

(22) Filed: Apr. 18, 2019

(65) Prior Publication Data

US 2019/0326134 A1    Oct. 24, 2019

(30) Foreign Application Priority Data

Apr. 19, 2018  (JP) .............................. JP2018-080406

(51) Int. Cl.
| | |
|---|---|
| *H01L 21/67* | (2006.01) |
| *H01L 21/677* | (2006.01) |
| *B05B 1/30* | (2006.01) |
| *B05B 1/00* | (2006.01) |

(52) U.S. Cl.
CPC ........ *H01L 21/67017* (2013.01); *B05B 1/005* (2013.01); *B05B 1/3013* (2013.01); *H01L 21/67766* (2013.01); *H01L 21/67778* (2013.01)

(58) Field of Classification Search
CPC .......................... H01L 21/67017; B05B 1/005
See application file for complete search history.

(56) References Cited

U.S. PATENT DOCUMENTS

| | | | |
|---|---|---|---|
| 2008/0035666 A1* | 2/2008 | Porras | H01L 21/67253 222/1 |
| 2011/0120572 A1* | 5/2011 | Ender | B41J 2/17523 137/343 |
| 2016/0169766 A1* | 6/2016 | Ishibashi | H01L 21/67253 73/40 |
| 2017/0025299 A1* | 1/2017 | Sasaki | H01L 21/67393 |
| 2017/0170042 A1 | 6/2017 | Okabe | |

FOREIGN PATENT DOCUMENTS

| | | |
|---|---|---|
| JP | 2011166047 A | 8/2011 |
| JP | 2014-112631 | 6/2014 |
| JP | 2017-108048 | 6/2017 |

OTHER PUBLICATIONS

Taiwan Patent Application No. 108113683, Office Action, dated Feb. 14, 2023.

* cited by examiner

*Primary Examiner* — Saul Rodriguez
*Assistant Examiner* — Willie Berry, Jr.
(74) *Attorney, Agent, or Firm* — Kilpatrick Townsend & Stockton LLP

(57) ABSTRACT

There is provided an exhaust nozzle unit capable of discharging a gas atmosphere in a substrate storage container having a loading/unloading opening from the container to an outside of the container through a port formed on a bottom surface of the container. The exhausted nozzle includes a nozzle capable of switching the port from a closed state to an open state by pressing a valve of the port; and a housing configured to hold the nozzle so as to be movable up and down between a use posture in which the port is in the open state and a standby posture in which the port is in the closed state.

7 Claims, 15 Drawing Sheets

EXHAUST NOZZLE UNIT, LOAD PORT, AND EFEM

CROSS-REFERENCE TO RELATED APPLICATION

This application is based upon and claims the benefit of priority from Japanese Patent Application No. 2018-080406, filed on Apr. 19, 2018, the entire contents of which are incorporated herein by reference.

TECHNICAL FIELD

The present disclosure relates to an exhaust nozzle unit for discharging a gas atmosphere in a container capable of accommodating a transfer target object such as a wafer or the like to the outside through a port formed on a bottom surface of the container, a load port including such an exhaust nozzle unit, and an equipment front end module (EFEM) including a load port and a transfer chamber having a transfer space therein.

BACKGROUND

For example, in a semiconductor manufacturing process, wafers are processed in a clean room to improve a yield and a quality. In recent years, there has been adopted a "mini-environment method" which further improves cleanliness only in a local space around a wafer. Also adopted is a means for carrying out wafer transfer and other processes. In the mini-environment method, a load port which constitutes a part of a wall surface of a substantially closed wafer transfer chamber (hereinafter referred to as "transfer chamber") in a housing and which has functions of mounting a transfer container (hereinafter referred to as "container") storing a transfer target object such as a wafer or the like in a highly clean internal space and opening or closing a door of the container (hereinafter referred to as "container door") while making close contact with the container door is provided adjacent to the transfer chamber. Hereinafter, a door of the load port capable of engaging with the container door and opening or closing the container door will be referred to as "load port door."

The load port is a device for taking a transfer target object into or out of the transfer chamber, and functions as an interface part between the transfer chamber and the container (for example, a front-opening unified pod (FOUP)). Then, when a door of the FOUP (hereinafter referred to as "FOUP door") and the load port door are simultaneously opened in a state in which the load port door is opposed to the FOUP door across a predetermined gap, the transfer target object present in the FOUP can be taken out into the transfer chamber or can be brought into the FOUP from the transfer chamber by a transfer robot (wafer transfer device) disposed in the transfer chamber.

In order to properly maintain an atmosphere around a wafer, a storage pod called the above-mentioned FOUP is used to store and manage the wafer inside the FOUP. Furthermore, an EFEM (Equipment Front End Module) configured using a transfer chamber and a load port is used to deliver a wafer between a processing apparatus for processing a wafer and an FOUP.

In recent years, high integration of devices and miniaturization of circuits have been progressed. It is required to keep the periphery of the wafer at a high degree of cleanliness so that particles and moisture do not adhere to a wafer surface. Therefore, in order to prevent a change in surface property such as oxidation of a wafer surface or the like, the inside of the FOUP is filled with nitrogen to keep the surrounding of the wafer in a nitrogen atmosphere which is an inert gas, or is maintained in a vacuum state.

Furthermore, in the most advanced process of a wafer, even the oxygen, moisture or the like contained in a clean air used as a down-flow constantly flowing from a fan filter unit disposed at an upper portion of a transfer chamber may change the properties of the wafer. For this reason, as in Patent Document 1, there has been a demand for a practical technique for circulating an inert gas in an EFEM.

Under such a technical background, an outgas is released from the wafer stored in a container after being processed. In particular, the amount of outgas released grows larger in the wafer immediately after processing. The surface of the wafer before and after processing, which is stored in the container, is easily contaminated. This may be one factor that hinders quality improvement.

In Patent Document 2, there is disclosed an EFEM in which a baffle plate is provided so that a part of a descending airflow formed in a wafer transfer chamber flows into a container such as a FOUP or the like connected to the wafer transfer chamber through an opening of a base and in which a structure including a bottom nozzle capable of communicating with a bottom hole formed at a position spaced apart from an opening of a base rather than a center of a bottom surface of the container and a gas discharge flow path capable of discharging a gas present inside the container to the outside of the container through the bottom nozzle is used as a load port. Patent Document 2 recites that, according to such an EFEM, it may be possible to effectively discharge the outgas released from a processed wafer to the outside of the container during the loading and unloading of the wafer through the opening of the base. That is, the opening of the base has a wide opening area and the descending gas flow is formed in the wafer transfer chamber to maintain high cleanliness. Therefore, due to the guidance of the descending gas flow by the baffle plate, the gas present in the wafer transfer chamber easily flows into the container.

In addition, the gas present in the container is discharged from the bottom hole spaced apart from the opening of the base. Therefore, a gas flow moving from the opening of the base toward the bottom hole of the container is formed throughout the inside of the container in which the wafer is accommodated. As the gas flow passes near the surface of the wafer accommodated in the container, the discharge of outgas is promoted. As a result, it is possible to prevent the wafer accommodated in the container from being oxidized or contaminated by the outgas generated from the processed wafer.

Prior Art Documents

Patent Documents

Patent Document 1: Japanese laid-open publication No. 2014-112631

Patent Document 2: Japanese laid-open publication No. 2017-108048

Here, the EFEM in the Patent Document 2 is set such that, throughout the internal space of the container, in order to allow the outgas to be discharged to the outside of the container along the gas flow coming from the transfer chamber without staying in the container, the gas is discharged from the port formed a position relatively far from the opening of the base among a plurality of ports (bottom holes) provided in the bottom portion of the container. That is, the nitrogen gas present in the transfer space is allowed to flow into the container and is exhausted from the back side in the container, whereby the outgas generated from the processed wafer mounted inside the container can be discharged to the outside of the container to keep the environment in the container clean and to protect the wafer surface from oxidation or contamination.

By the way, at a semiconductor manufacturing site (semiconductor manufacturing line), there has been used a load port which has a bottom purge function of injecting a nitrogen gas (purge gas) from a bottom portion of a FOUP into the internal space of the FOUP as a container to replace the inside of the FOUP with the nitrogen gas. In a bottom purge process generally performed at present, there has been performed a process in which the port provided at a position relatively far from an opening of a base among a plurality of ports provided at the bottom portion of the FOUP is connected to a supply nozzle of the load port and the port provided at a position relatively close to the opening of the base is connected to an exhaust nozzle of the load port, whereby a gas flow moving from the back side (far from a FOUP door) to the front side (close to a FOUP door) is formed to fill the FOUP with a purge gas.

Thus, the FOUP generally used at preset has a supply port existing on the back side far from the opening of the base. A valve for preventing reverse flow is provided in the supply port. The valve of the supply port is lifted by the pressure attributable to the supply of the purge gas, whereby the purge gas can be supplied into the FOUP.

Therefore, in order to realize the configuration of Patent Document 2, it is not possible to use the general FOUP currently used as a container and it is necessary to completely change the FOUP to a new container. A large number of containers (FOUPs) are already widely used at a semiconductor manufacturing line. It is burdensome for a user to adopt the configuration of Patent Document 2 by replacing all the containers. Presumably, it is difficult for the configuration of Patent Document 2 to be introduced into a manufacturing site.

SUMMARY

The present disclosure has been made in view of such problems. It is a main object of the present disclosure to provide an exhaust nozzle unit capable of exhausting a gas present in a container by forcibly opening a port existing on the back side in the container regardless of the supply pressure of the gas, and to provide a technique capable of realizing a load port provided with such an exhaust nozzle unit and configured to exhaust a gas existing in a container to the outside of the container through a port existing on the back side in the container, and ultimately an equipment front end module (EFEM), by using a conventional container. In addition, the present disclosure is a technique capable of coping with containers other than a FOUP.

That is, the present disclosure relates to an exhaust nozzle unit capable of discharging a gas atmosphere in a substrate storage container having a loading/unloading opening from the container to the outside through a port formed on a bottom surface of the container.

The exhaust nozzle unit according to the present disclosure is characterized by including: a nozzle capable of switching the port from a closed state to an open state by pressing a valve of the port; and a housing configured to hold the nozzle so as to be movable up and down between a use posture in which the port is in the open state and a standby posture in which the port is in the closed state.

According to the exhaust nozzle unit described above, the port can be opened by switching the nozzle from the standby posture to the use posture. Accordingly, it is possible to switch the port from the closed state to the open state regardless of the pressure of the gas supplied from the exhaust nozzle unit. By connecting such an exhaust nozzle unit to an arbitrary port provided on the bottom surface of the substrate storage container, the port provided at a position relatively far from the loading/unloading opening of the container (a position on the back side far from the loading/unloading opening in the container) among the ports can be forcibly opened regardless of the supply pressure of the gas. As a result, the gas atmosphere in the container can be discharged to the outside of the container through the port provided at a position relatively far from the loading/unloading opening of the container and the exhaust nozzle unit connected to the port. As compared with the configuration in which the gas atmosphere is exhausted to the outside of the container through the port provided at a position relatively close to the loading/unloading opening of the container (a position on the front side close to the loading/unloading opening in the container) and the exhaust nozzle unit connected to the port, it is possible to efficiently discharge the gas existing in the container (the gas containing the outgas released from the wafer existing in the container) to the outside of the container.

As described above, according to the present disclosure, while using the container already used in many manufacturing sites as it is, it is possible to realize an exhaust nozzle unit capable of exhausting the gas taken into the container from the transfer space to the outside through the port formed on the back side in the container.

In most cases, the spaced-apart distance between the port (exhaust port) provided at a position (position on the back side) relatively far from the loading/unloading opening of the container and the loading/unloading opening is two thirds or more of the wafer stored in the container. This is also a factor that makes it possible to efficiently discharge the gas containing the outgas released from the wafer to the outside of the container.

In the exhaust nozzle unit of the present disclosure, if the nozzle includes a first nozzle capable of making close contact with the outer edge of the port and a second nozzle configured to press the valve of the port, the port can be opened by pressing the valve with the second nozzle in an airtight state in which the first nozzle is brought into close contact with the outer edge of the port, and the gas existing in the container can be prevented from flowing out of the container through the gap between the exhaust nozzle unit and the port.

In particular, when the nozzle having an operation adjustment space between the nozzle and the housing is adopted as the exhaust nozzle unit of the present disclosure, it is possible to adopt a configuration in which the nozzle is operated between the use posture and the standby posture by taking the nozzle control gas into and out of the operation adjustment space. With such a configuration, a dedicated driving mechanism for driving the nozzle is unnecessary, and the operation of changing the posture of the nozzle can be controlled with a simple configuration.

Furthermore, the load port according to the present disclosure is configured to include a mounting table on which a container is mounted and an exhaust nozzle unit of the above-described configuration disposed at a predetermined location on the mounting table. With such a load port, it is possible to achieve the effects based on the configuration of the exhaust nozzle unit described above and to exhaust the gas existing in the container to the outside of the container through the port formed on the back side in the container.

Furthermore, an EFEM is characterized by including: a transfer chamber in which a transfer robot for transferring a transfer target object between a container having a loading/unloading opening and a transfer space is disposed; and a load port including a mounting table on which the container is mounted, wherein the load port includes a purge device capable of replacing the gas atmosphere in the container with an environmental gas, the purge device includes at least one exhaust nozzle unit disposed at a predetermined location on the mounting table and connected to at least one port provided on a bottom surface of the container, and the exhaust nozzle unit includes a nozzle capable of switching the port from a closed state to an open state by pressing a valve of the port, and a housing configured to hold the nozzle so as to be movable up and down between a use posture in which the port is in the open state and a standby posture in which the port is in the closed state. In such an EFEM, the purge device of the load port includes the above-described exhaust nozzle unit. Therefore, the port formed on the back side in the container is forcibly opened by the exhaust nozzle unit, and the gas existing in the container can be exhausted to the outside of the container through the port.

If the EFEM according to the present disclosure adopts a configuration in which the descending gas flow formed in the transfer space can be introduced into the container via the loading/unloading opening, the gas flow as a part of the descending gas flow formed in the transfer space and introduced into the container can be discharged together with the gas atmosphere existing in the container to the outside of the container through the port provided at a position relatively far from the loading/unloading opening of the container and the exhaust nozzle unit connected to the port.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an embodiment of the present disclosure will be described with reference to the drawings.

Figure 1:
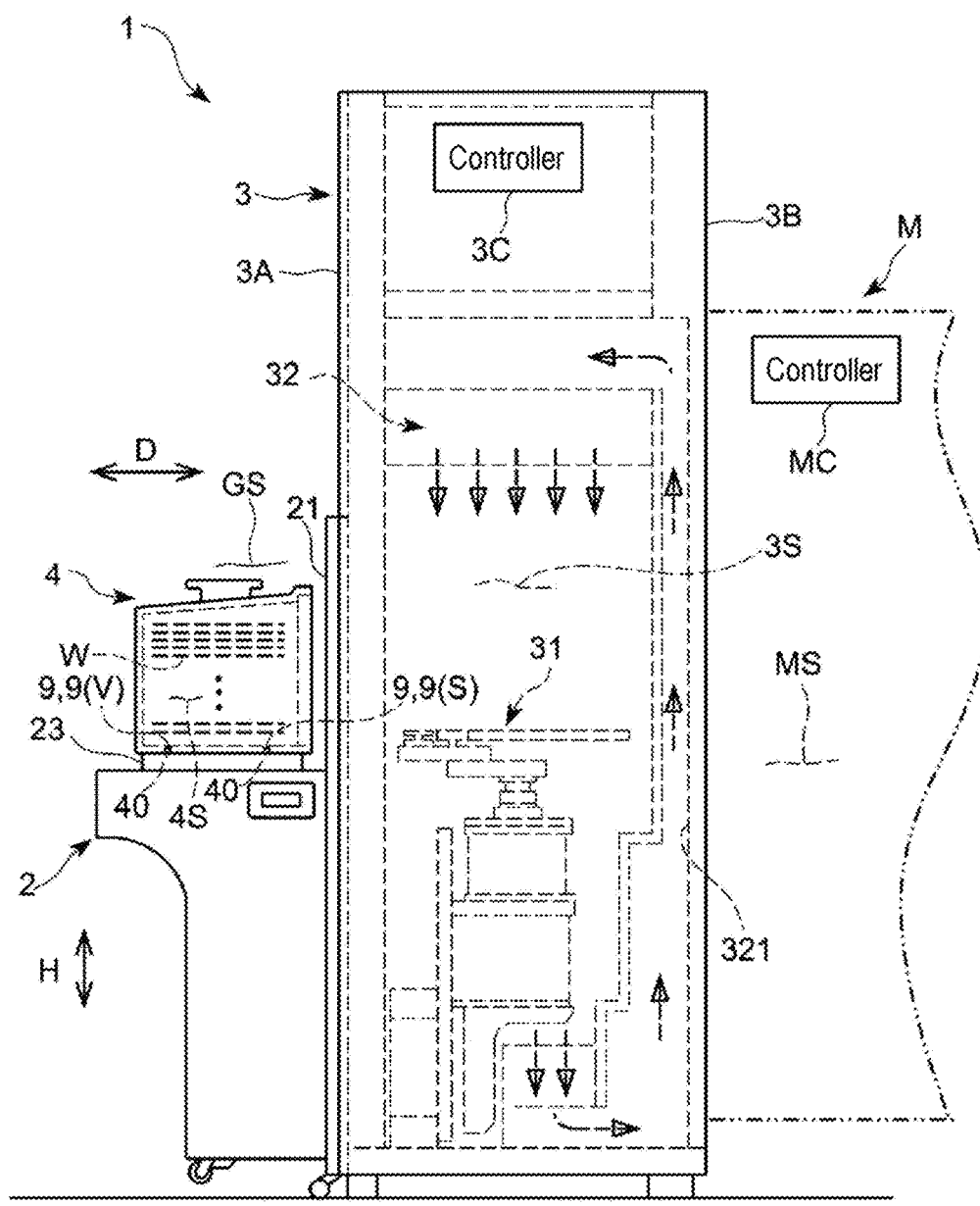
FIG. 1 is a side view schematically showing a relative positional relationship between an EFEM according to an embodiment of the present disclosure and its peripheral devices.

A purge nozzle unit 9 according to the present embodiment is disposed at a predetermined position of, for example, a mounting table 23 of a load port 2 shown in FIG. 1. FIG. 1 schematically shows a relative positional relationship between an EFEM (Equipment Front End Module) including a load port 2 and a transfer chamber 3 disposed in a clean room and its peripheral devices. The EFEM 1 is used, for example, in a semiconductor manufacturing process. In the following description, there will be described an aspect in which for example, a wafer W as a transfer target object is transferred between a substrate storage container 4 (for example, an FOUP in the present embodiment) and a transfer chamber 3 (wafer transfer chamber). In addition, the size of a wafer handled by the EFEM is standardized as the SEMI (Semiconductor Equipment and Materials International) standard. However, the diameter of a wafer has become larger from the viewpoint of productivity improvement. Thus far, the diameter of a wafer has been increased from 300 mm to 450 mm to 500 mm.

In the following description, in a front-rear direction D in which the FOUP 4, the load port 2 and the transfer chamber 3 are arranged in this order, the side of the transfer chamber 3 is defined as "rear", the side of the FOUP 4 is defined as "front", and the direction orthogonal to the front-rear direction D and the vertical direction H is defined as "lateral."

Figure 2:
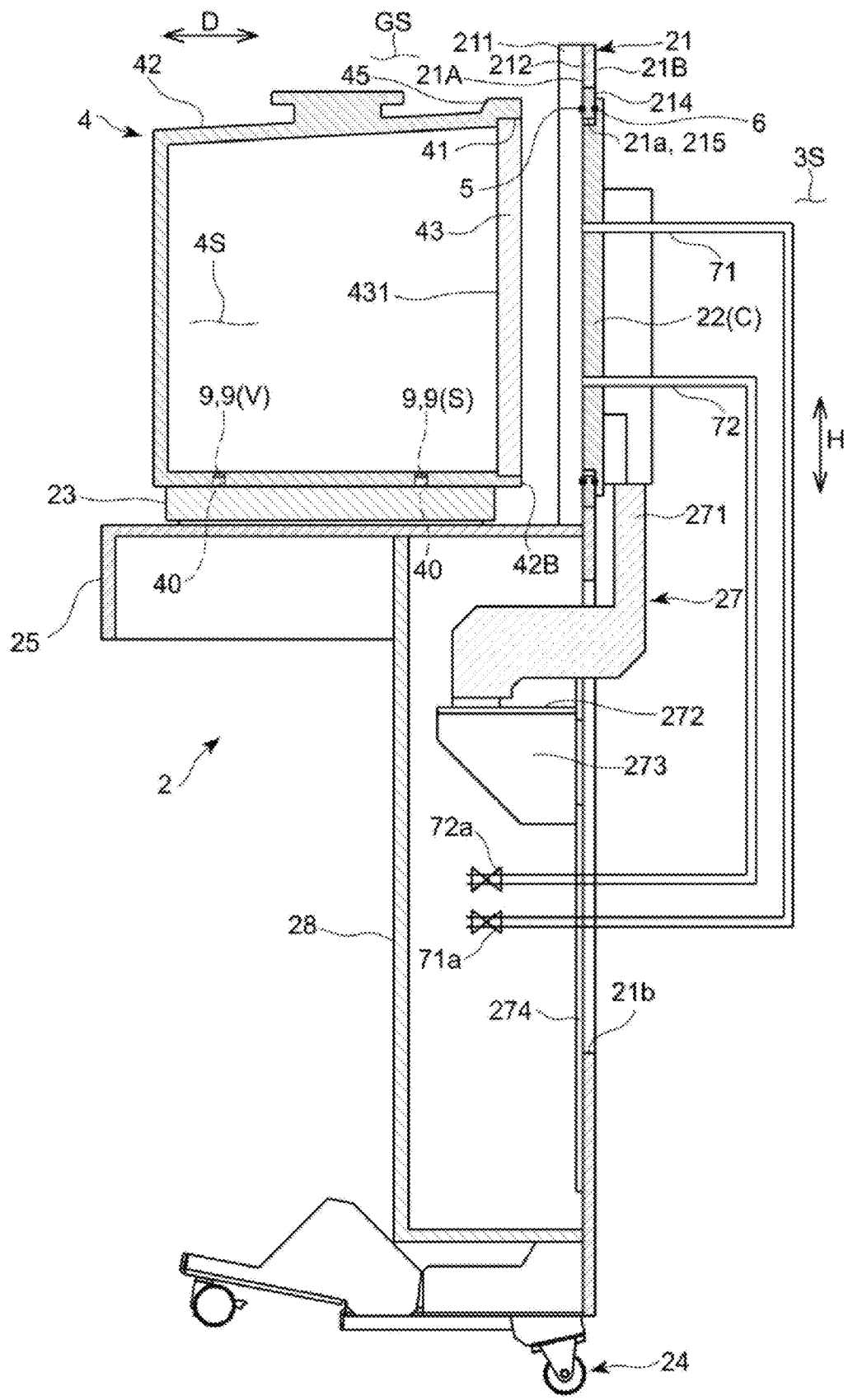
FIG. 2 is a view schematically showing a side cross section of a load port according to the embodiment, in which a container is spaced apart from a frame with a load port door kept in a fully closed position.
Figure 12:
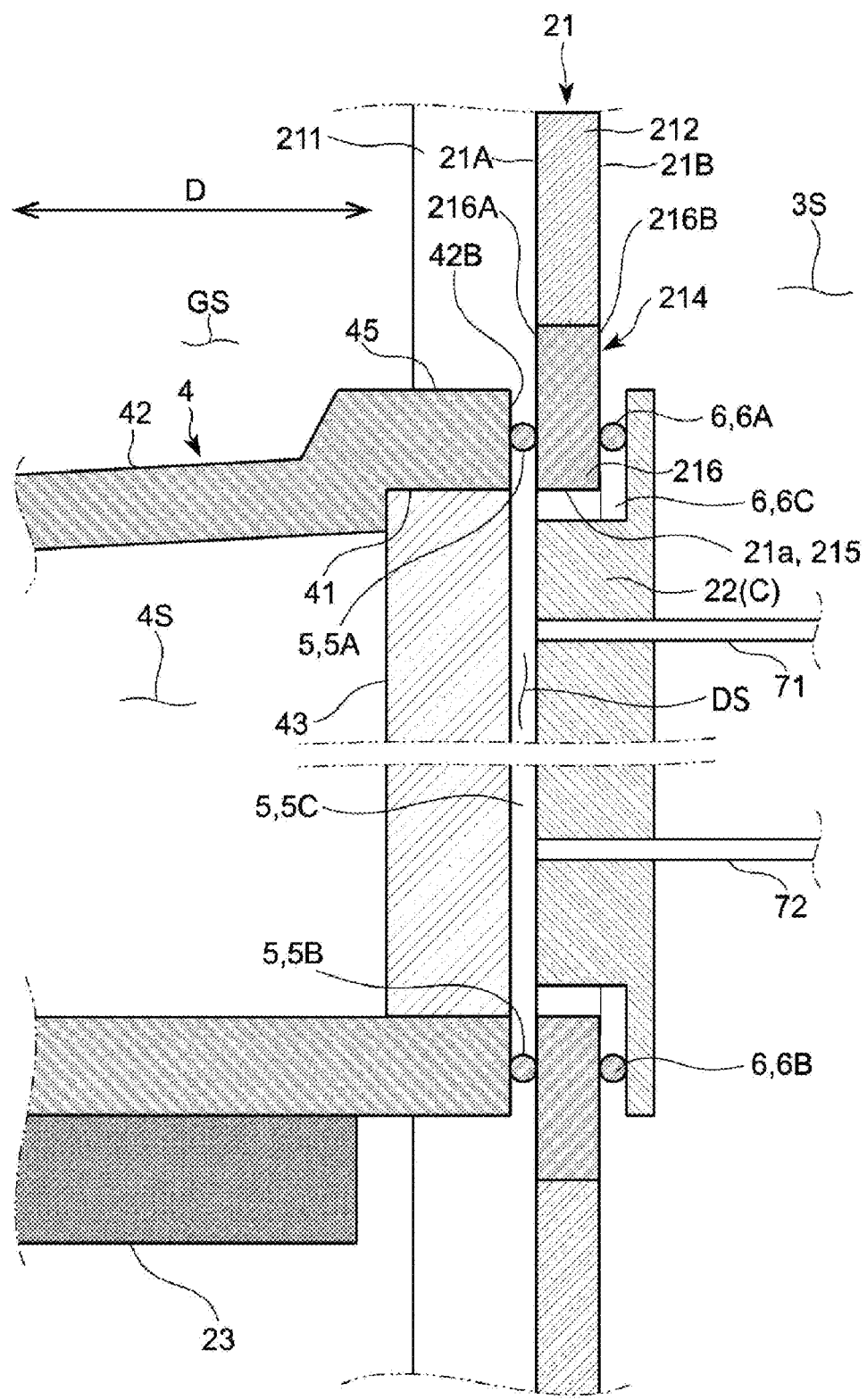
FIG. 12 is an enlarged schematic view showing main parts in FIG. 9.

As shown in FIGS. 1, 2 and 12, the FOUP 4 according to the present embodiment includes an FOUP body 42 which can open an internal space 4S only rearward via a loading/unloading opening 41 formed on a rear surface 42B (a surface on the side of a base 21), and a FOUP door 43 capable of opening and closing the loading/unloading opening 41. The FOUP 4 is a known one which is configured to accommodate a plurality of wafers W as transfer target objects in multiple stages in a vertical direction H and to load and unload the wafers W via the loading/unloading opening 41.

The FOUP body 42 has a front wall, a pair of left and right side walls, a top wall and a bottom wall which are integrally formed with each other. A shelf portion (wafer-mounting portion) capable of mounting the wafers W at a predetermined pitch in multiple stages is provided in the internal space 4S surrounded by the respective walls. As indicated by an imaginary line (two-dot chain line) in FIG. 1 and so forth, ports 40 are provided at predetermined locations on the bottom wall of the FOUP body 42. Each of the ports 40 is mainly made of, for example, a hollow cylindrical grommet seal fitted to a port attachment through-hole formed on the bottom wall of the FOUP body 42 and is configured to be opened and closed by a check valve.

Figure 3:
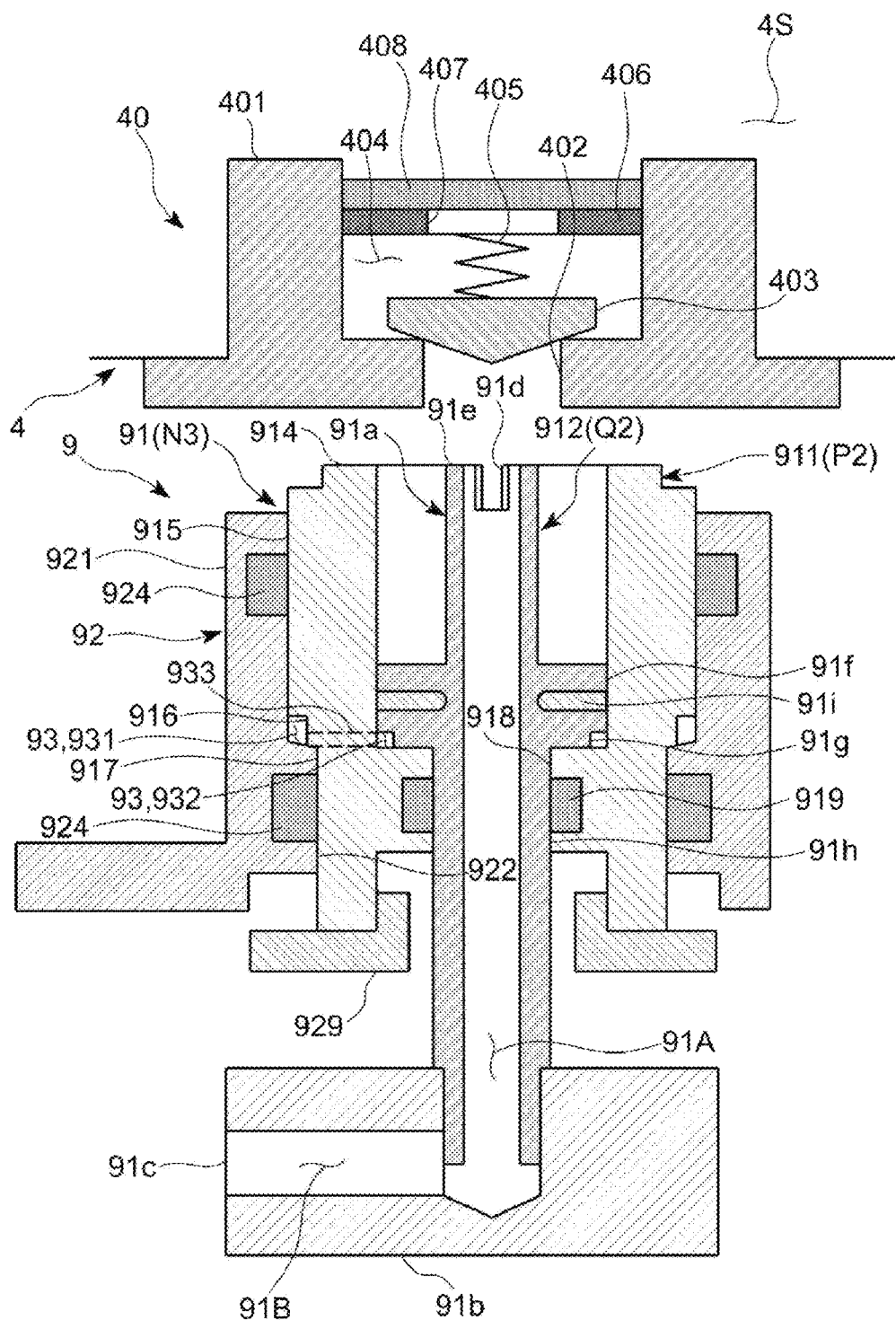
FIG. 3 is a view schematically showing, in a partial cross section, a relative positional relationship between an exhaust nozzle unit and a port when a nozzle according to the embodiment is in a standby posture.
Figure 4:
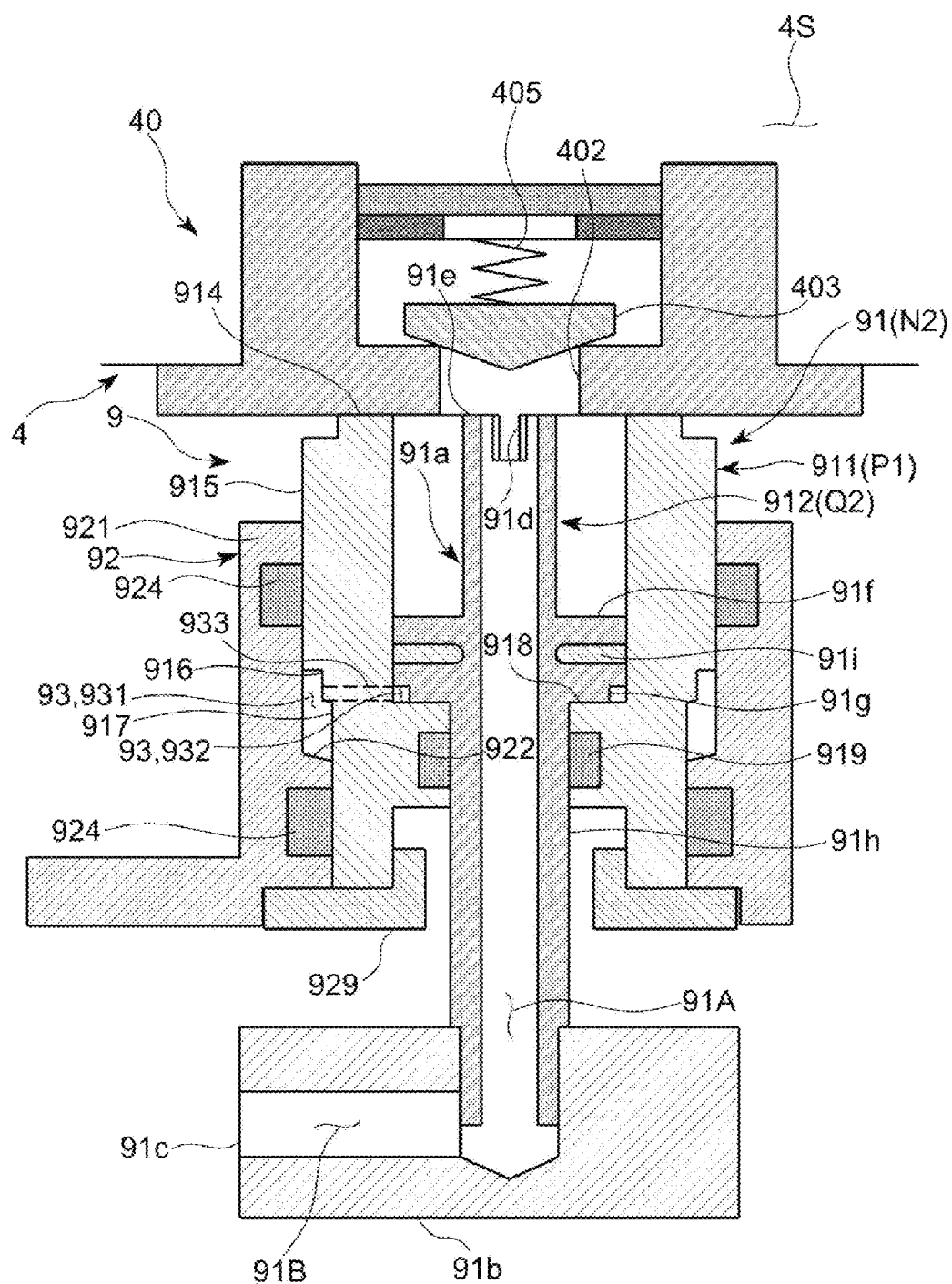
FIG. 4 is a view corresponding to FIG. 3, showing a relative positional relationship between the exhaust nozzle unit and the port when the nozzle according to the embodiment is in an intermediate posture.
Figure 5:
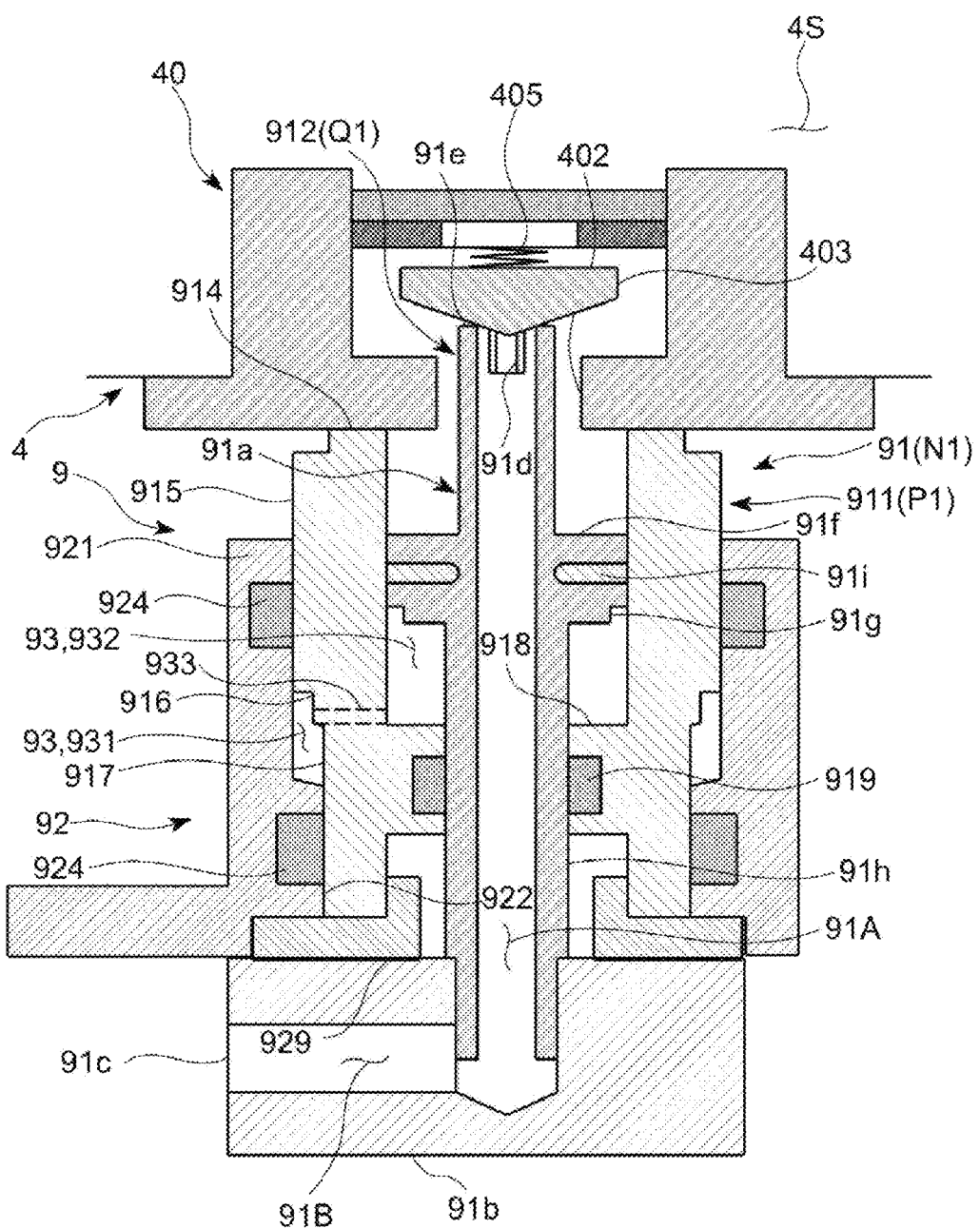
FIG. 5 is a view corresponding to FIG. 3, showing a relative positional relationship between the exhaust nozzle unit and the port when the nozzle according to the embodiment is in a use posture.

A specific example of the port 40 may be a port which includes, as shown in FIGS. 3 to 5, a cylindrical base 401 formed of a bottomed lidless grommet seal, a vent 402 formed in the bottom portion of the base 401 which is a portion exposed to the outside GS of the FOUP 4, a check valve 403 (corresponding to the "valve" in the present disclosure) movably disposed in a valve chamber 404 formed inside the base 401, and a compression spring 405 configured to bias the check valve 403 toward the vent 402. Such a port 40 is switchable between a closed state (see FIGS. 3 and 4) in which the vent 402 is closed by the check valve 403 and an open state (see FIG. 5) in which the check valve 403 is moved away from the vent 402 against the biasing force of the compression spring 405 to open the vent 402. The vent 402, the check valve 403 and the compression spring 405 constitute an opening/closing mechanism.

The port 40 shown in FIG. 3 and so forth includes a support plate 406 configured to support the compression spring 405 inside the base 401, a through-hole 407 formed in a part of the support plate 406, and a filter 408 provided at a position closer to the internal space 4S of the FOUP 4 than the through-hole 407. Such a port 40 functions as a gas supply hole (gas supply port) when supplying a gas into the FOUP 4 and functions as an exhaust hole (exhaust port) when discharging a gas from the inside of the FOUP 4. In the present embodiment, the process of switching the port 40 from the closed state to the open state may be performed in association with the operation of a purge nozzle unit 9 (exhaust nozzle unit) provided on the mounting table 23 of the load port 2.

A flange portion held by a container transfer device (for example, an OHT: Over Head Transport) is provided in a central portion of an upper surface of the top wall of the FOUP body 42. Furthermore, a collar portion 45 which protrudes upward and toward both sides more than other portions is provided at the rear end portion of the FOUP body 42. In other words, the collar portion 45 is provided in the FOUP body 42 at the peripheral portion of a region where the FOUP door 43 is disposed.

The FOUP door 43 faces the load port door 22 of the load port 2 in a state in which the FOUP 4 is mounted on the below-described mounting table 23 of the load port 2. The FOUP door 43 has a substantially plate shape. The FOUP door 43 is provided with a latch (not shown) capable of locking the FOUP door 43 to the FOUP body 42. A gasket (not shown) is provided at a predetermined portion of an inward surface 431 of the FOUP door 43, which makes contact with or comes close to the FOUP body 42 in a state in which the loading/unloading opening 41 is closed by the FOUP door 43. The internal space 4S of the FOUP 4 can be sealed by bringing the gasket into contact with the FOUP body 42 and elastically deforming the gasket in preference to the inward surface 431 of the FOUP door 43.

As shown in FIGS. 1, 2 and 6 to 8, the load port 2 according to the present embodiment includes a plate-shaped base 21 constituting a part of a front wall surface 3A of the transfer chamber 3 and having an opening portion 21a for opening a transfer space 3S of the transfer chamber 3, a load port door 22 configured to open and close the opening portion 21a of the base 21, and a mounting table 23 provided on the base 21 in a substantially horizontal posture. In this regard, the opening portion 21a for opening the transfer space 3S of the transfer chamber 3 is an opening formed in the base 21 to open the transfer space 3S of the transfer chamber 3 which is a space partitioned by the base 21.

The base 21 is arranged in a standing posture and formed in a substantially rectangular plate-like shape so as to have the opening portion 21a of such a size that can communicate with the loading/unloading opening 41 of the FOUP 4 mounted on the mounting table 23. The load port 2 of the present embodiment can be used in a state where the base 21 is brought into close contact with the transfer chamber 3. Furthermore, a leg part 24 having a caster and an installation leg is provided at the lower end of the base 21. In the present embodiment, there is adopted the base 21 which includes columns 211 erected on both sides, a base body 212 supported by the columns 211 and a window unit 214 attached to a window portion 213 opened in the base body 212 in a substantially rectangular shape.

The window unit 214 is provided at a position facing the FOUP door 43. The opening portion 215 provided in the window unit 214 is an opening portion via which a transfer target object (wafer W) can pass.

As used herein, the term "substantially rectangular" refers to a shape which adopts a rectangular shape having four sides as a basic shape with four corners smoothly connected by arcs. Although not shown, a gasket as an elastic member formed in a rectangular frame shape is provided in the vicinity of the outer periphery of the surface (rear surface) of the base body 212 on the side of the transfer chamber 3. The gap between the base body 212 and the transfer chamber 3 is eliminated by bringing the gasket into contact with the vicinity of the edge of the opening of the transfer chamber 3 to which the base 21 is mounted.

Figure 6:
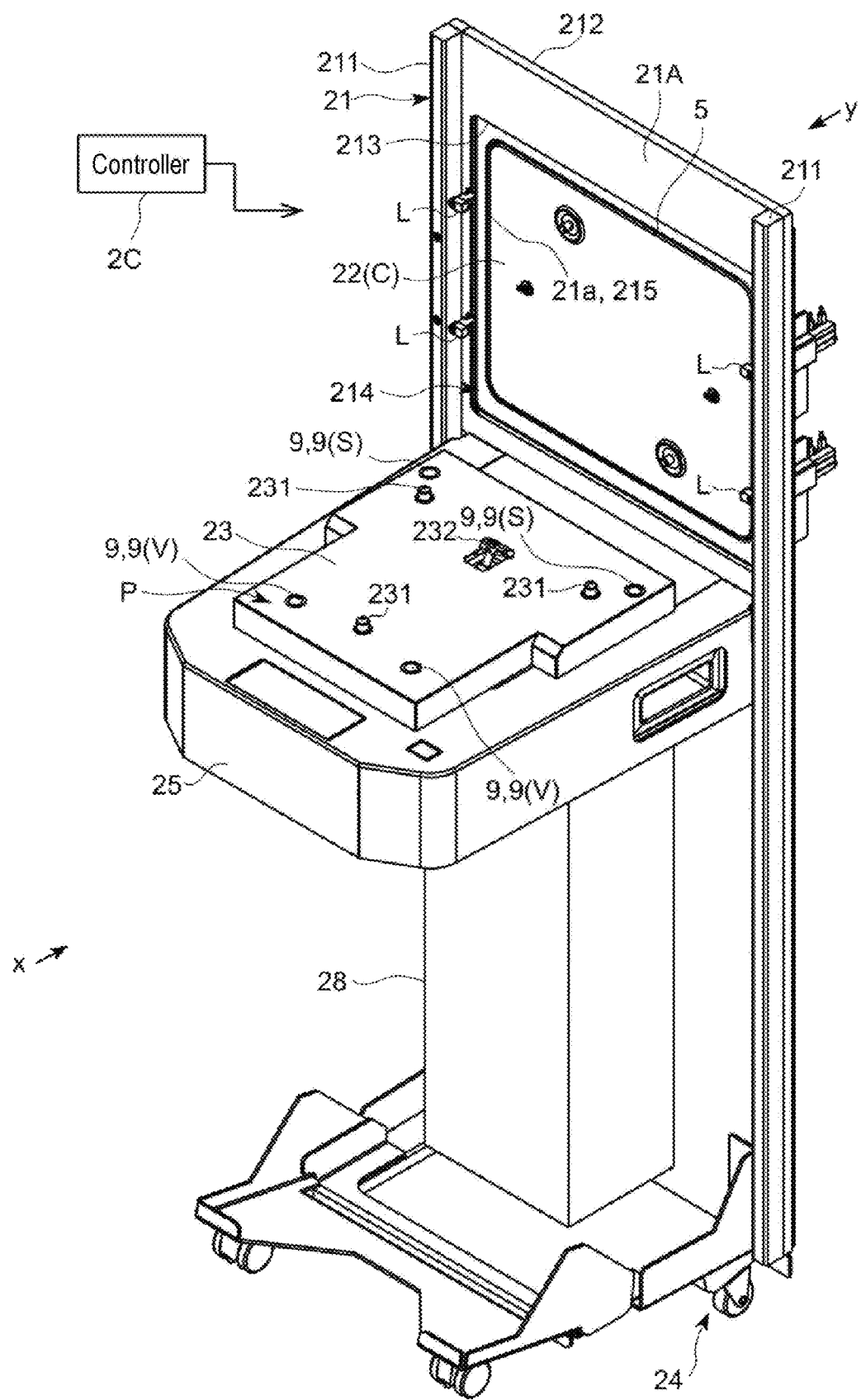
FIG. 6 is a perspective view showing a load port according to an embodiment with a part thereof omitted.

The mounting table 23 is provided above a horizontal base 25 (support table) which is disposed in a substantially horizontal posture at a position slightly above the center in the height direction of the base 21. The mounting table 23 is capable of mounting the FOUP 4 in an orientation in which the FOUP door 43 capable of opening and closing the internal space 4S of the FOUP body 42 faces the load port door 22. Furthermore, the mounting table 23 is configured to be movable forward and backward with respect to the base 21 between a predetermined docking position (see FIG. 9) at which the FOUP door 43 approaches the opening portion 21a of the base 21 and a position (see FIG. 2) at which the FOUP door 43 is spaced apart from the docking position by a predetermined distance with respect to the base 21. As shown in FIG. 6, the mounting table 23 has a plurality of protrusions (pins) 231 protruding upward. The positioning of the FOUP 4 on the mounting table 23 is achieved by bringing these protrusions 231 into engagement with holes (not shown) formed on the bottom surface of the FOUP 4. In FIG. 2 and so forth, a state in which the bottom surface of the FOUP 4 makes contact with the upper surface of the mounting table 23 is shown as the mounting state of the FOUP 4 on the mounting table 23. However, in practice, the positioning protrusions 231 protruding upward beyond the upper surface of the mounting table 23 engage with the bottomed holes formed on the bottom surface of the FOUP 4, thereby supporting the FOUP 4. The top surface of the mounting table 23 and the bottom surface of the FOUP 4 do not make contact with each other. A predetermined gap is defined between the top surface of the mounting table 23 and the bottom surface of the FOUP 4. In addition, a locking claw 232 for fixing the FOUP 4 to the mounting table 23 is provided. The locking claw 232 is hooked and fixed to a locked portion (not shown) provided on the bottom surface of the FOUP 4 so that the locking claw 232 can cooperate with the positioning protrusions 231 to fix the FOUP 4 while guiding the FOUP 4 to an appropriate position on the mounting table 23. In addition, the FOUP 4 can be made separable from the mounting table 23 by releasing the locking state of the locking claw 232 with respect to the locked portion provided on the bottom surface of the FOUP 4.

The load port door 22 includes a connection mechanism 221 (see FIG. 8) capable of being switchable between a lid connection state in which the connection mechanism 221 can be connected to the FOUP door 43 to remove the FOUP door 43 from the FOUP body 42 and a lid connection release state in which the connection of the connection mechanism 221 to the FOUP door 43 is released to attach the FOUP door 43 to the FOUP body 42. The load port door 22 is movable along a predetermined movement path while holding the FOUP door 43 in an integrated state by the connection mechanism 221. The load port 2 of the present embodiment is configured to move the load port door 22 at least between a position shown in FIGS. 6 to 9, i.e., a fully closed position (C) in which the internal space 4S of the FOUP body 42 is closed by the FOUP door 43 held by the load port door 22, and a position shown in FIG. 10, i.e., an open position (O) in which the FOUP door 43 held by the load port door 22 is spaced apart from the FOUP body 42 to open the internal space 4S of the FOUP body 42 toward the transfer chamber 3. The load port 2 of the present embodiment is configured to move the load port door 22 located in the fully closed position (C) to the open position (O) shown in FIG. 10 while maintaining the standing posture of the load port door 22 and is further configured to downwardly move the load port door 22 from the open position (O) shown in FIG. 10 to a fully open position (not shown) while maintaining the standing posture of the load port door 22. That is, the movement path of the load port door 22 between the fully closed position (C) and the fully open position includes a path (horizontal path) along which the load port door 22 located at the fully closed position (C) is moved to the open position (O) toward the transfer chamber 3 while maintaining the height position thereof, and a path (vertical path) along which the load port door 22 located in the open position (O) is moved downward while maintaining the front-back position thereof. At the open position (O) which is a point where the horizontal path and the vertical path intersect, the movement direction of the load port door 22 is switched from the horizontal direction to the vertical direction or from the vertical direction to the horizontal direction. In order to enable the load port door 22 located at the open position (O) to move in both the vertical direction and the horizontal direction, the FOUP door 43 held by the load port door 22 located at the open position (O) is located together with the load port door 22 at a position rearward of the base 21 (a position where the FOUP door 43 is completely separated from the FOUP body 42 and disposed in the transfer space 3S of the transfer chamber 3).

Figure 7:
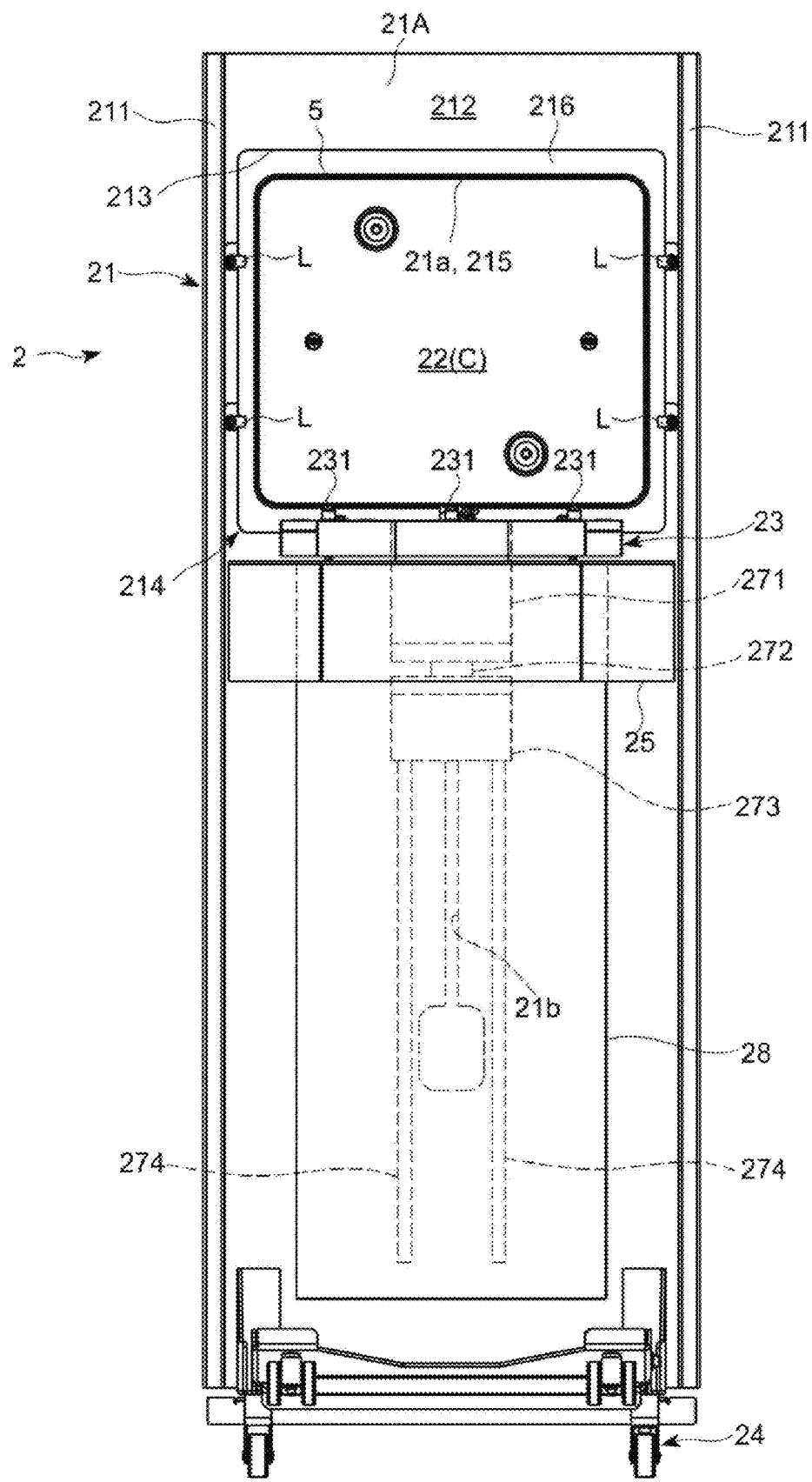
FIG. 7 is a view seen in an x-direction in FIG. 6.

Such movement of the load port door 22 is realized by a door-moving mechanism 27 provided in the load port 2. As shown in FIGS. 2, 7 and so forth, the door-moving mechanism 27 includes a support frame 271 for supporting the load port door 22, a movable block 273 for supporting the support frame 271 via a slide support portion 272 so as to be movable in a front-rear direction D, a slide rail 274 for supporting the movable block 273 so as to be movable in a vertical direction H, and a drive source (for example, an actuator not shown) for moving the load port door 22 in the front-rear direction D along the horizontal path and in the vertical direction H along the vertical path. The load port door 22 can be moved in the front-rear direction D and the vertical direction H as a drive command and is given to the actuator from a controller 2C. It may be possible to adopt an aspect in which an actuator for back-and-forth movement and an actuator for up-and-down movement are separately provided, or an aspect in which the back-and-forth movement and the up-and-down movement are performed by using a common actuator as a drive source.

The support frame 271 supports the lower rear side of the load port door 22. The support frame 271 is a substantially crank-like member that extends downward and then protrudes to the outside of the transfer chamber 3 (the side of the mounting table 23) through a slit-like insertion hole 21b formed in the base 21. In the present embodiment, the slide support portion 272 for supporting the support frame 271, the movable block 273 and the slide rail 274 are disposed outside the transfer chamber 3. The slide support portion 272, the movable block 273 and the slide rail 274 are sliding positions when moving the load port door 22. In the present embodiment, by disposing the slide support portion 272, the movable block 273 and the slide rail 274 outside the transfer chamber 3, even if particles are generated at the time of movement of the load port door 22, it is possible to prevent or suppress a situation in which particles enter into the transfer chamber 3, due to the formation of the insertion hole 21b in a minute slit shape. Furthermore, there is provided a cover 28 for covering parts and portions of the door-moving mechanism 27 disposed outside the transfer chamber 3, specifically, a part of the support frame 271, the slide support portion 272, the movable block 273 and the slide rail 274. Thus, the environmental gas present in the transfer chamber 3 is prevented from flowing out to the outside GS of the EFEM 1 through the aforementioned insertion hole 21b formed in the base 21.

As shown in FIGS. 2, 9 to 12 and so forth, the load port 2 according to the present embodiment includes a first seal portion 5 and a second seal portion 6 provided near the peripheral edge of the opening portion 21a. The load port 2 is configured so that, in a state in which the load port door 22 is kept in a closed state and the FOUP door 43 is brought into contact with the base 21 via the first seal portion 5, the space in which the FOUP door 43 and the load port door 22 are separated by a predetermined gap in the front-rear direction D so as to face each other is partitioned from the outside GS by the first seal portion 5 and the second seal portion 6 to form a sealed space DS. In the present embodiment, the first seal portion 5 and the second seal portion 6 are unitized as the window unit 214 described above.

Figure 11:
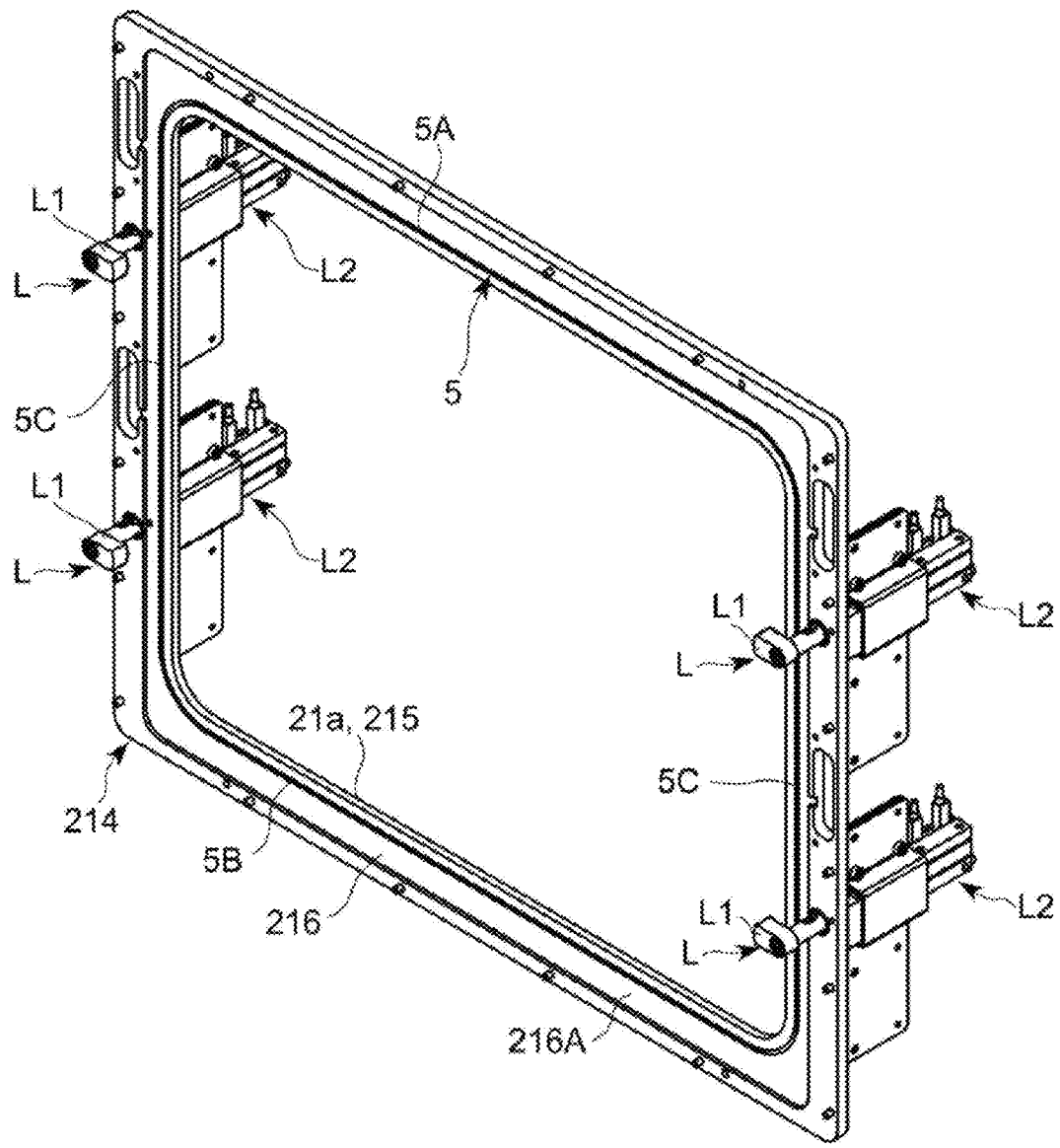
FIG. 11 is an overall perspective view of a window unit according to the embodiment.

As shown in FIGS. 6 and 11, the window unit 214 mainly includes a frame-shaped window frame part 216 having a substantially rectangular opening portion 215 at a position facing the FOUP door 43 in the window unit 214 (at a central portion of the window unit 214 in the illustrated example). In the present embodiment, the FOUP door 43 can be moved into the transfer chamber 3 via the opening portion 215 of the window frame part 216 while being held by the load port door 22. The opening portion 215 of the window frame part 216 is the opening portion 21a of the base 21.

The first seal portion 5 is provided so as to go around the opening portion 21a in the area near the opening edge of the opening portion 21a on the front surface of the base 21. When the mounting table 23 supporting the FOUP 4 is located at the docking position, the first seal portion 5 seals a gap between the peripheral edge of the opening portion 21a of the base 21 and the FOUP 4 (see FIG. 11). In the present embodiment that adopts the configuration in which the window unit 214 is attached to the base 21, the first seal portion is provided at a position around the opening portion 215 in the area near the opening edge of the opening portion 215 on the front surface 216A of the window frame part 216. When the mounting table 23 supporting the FOUP 4 is located at the docking position, such a first seal portion 5 is interposed between the peripheral edge of the opening portion 21a of the base 21 and the FOUP 4 to function as a seal.

Figure 9:
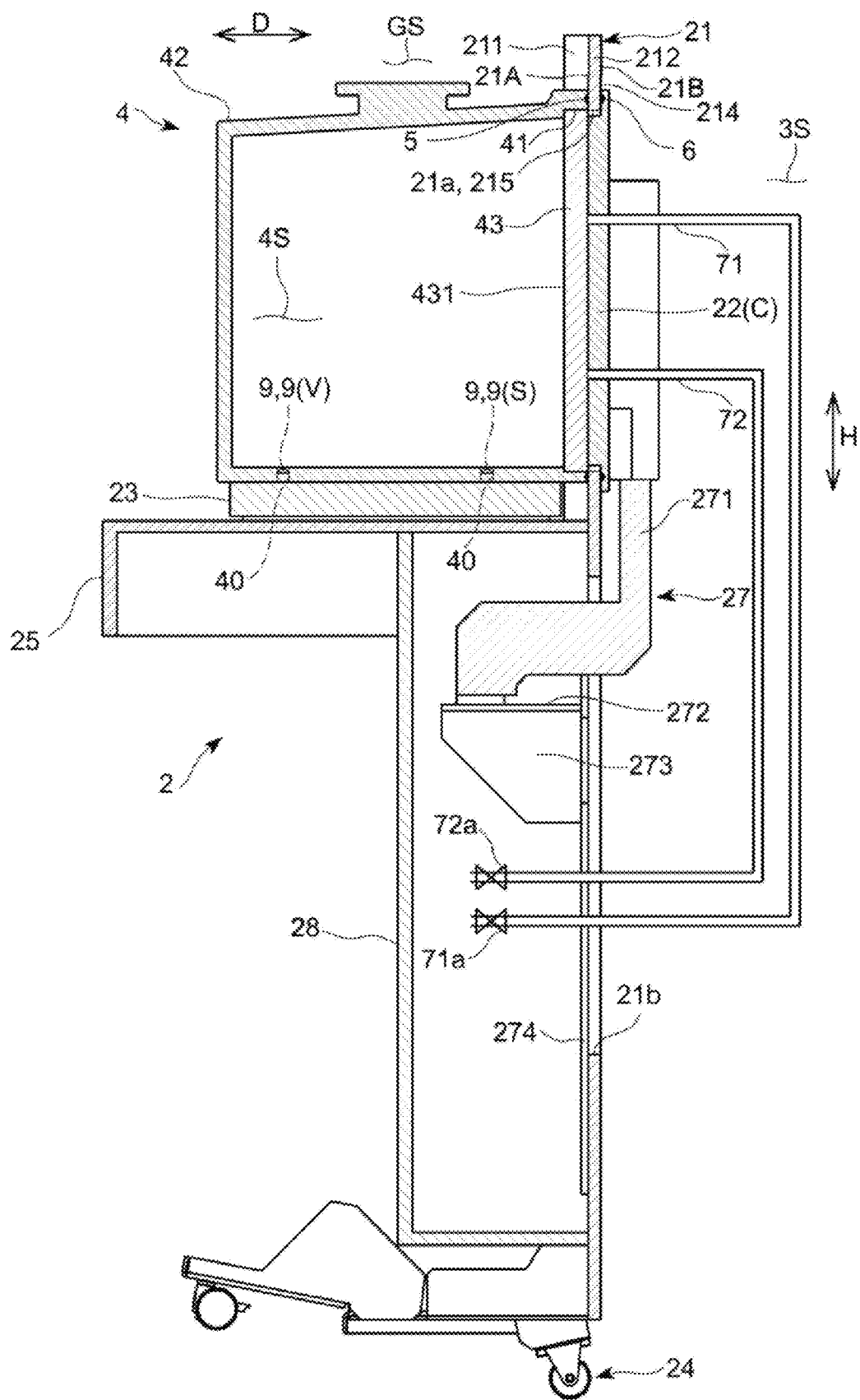
FIG. 9 is a view corresponding to FIG. 2, showing a state in which the container abuts against the frame via a first seal with the load port door kept in a fully closed position.
Figure 10:
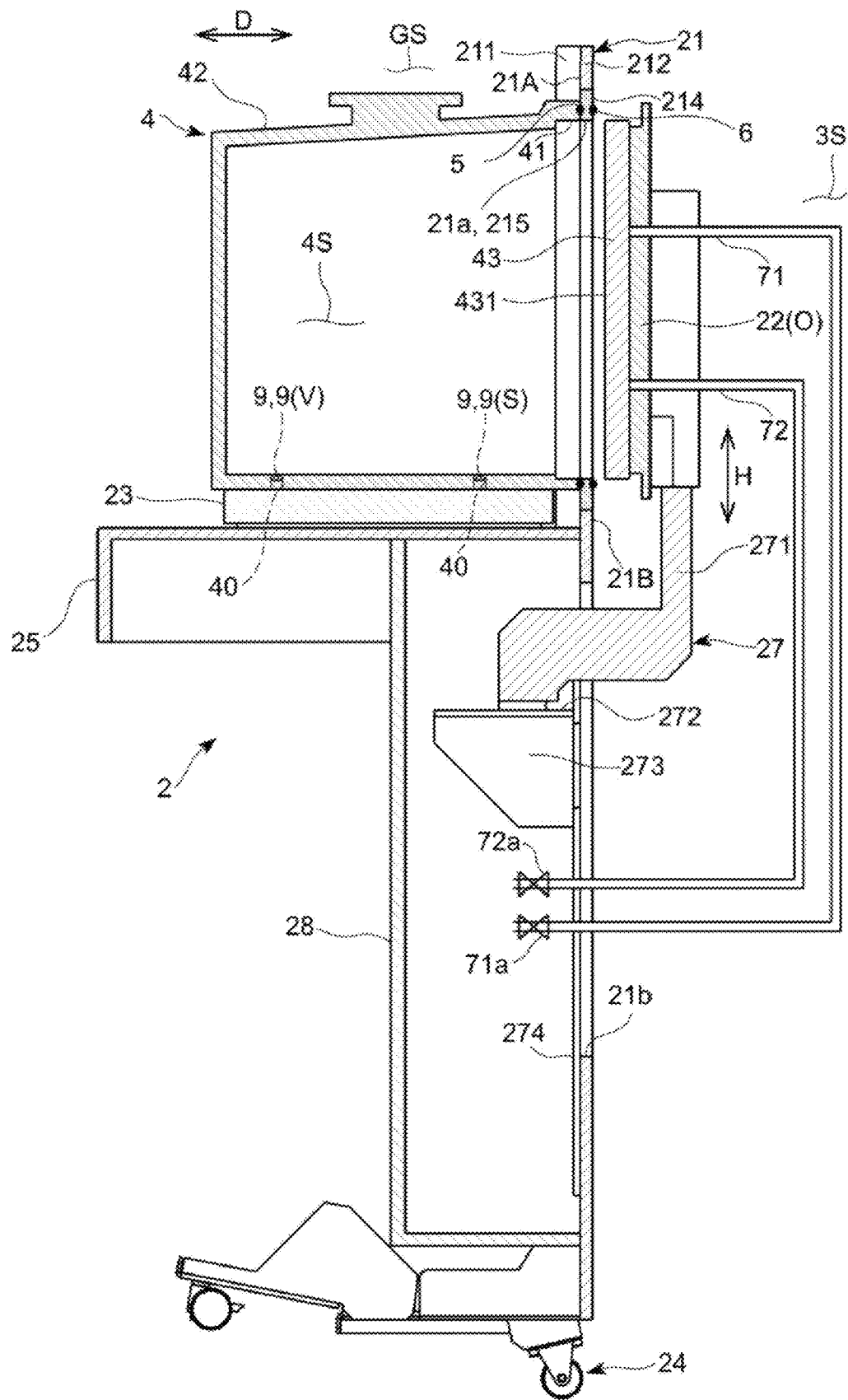
FIG. 10 is a view corresponding to FIG. 2, showing a state in which the load port door is kept in an open position.

In FIGS. 2, 9 and 10, the first seal portion 5 and the second seal portion 6 are schematically shown by substantially elliptical marks filled in black. Although the rear surface 42B (seal surface) of the FOUP body 42 is in contact with the base 21 (window unit 214) in FIGS. 9 and 10, the seal surface of the FOUP body 42 does not actually make contact with the base 21 (the window unit 214). As described above, the first seal portion 5 is interposed between the seal surface of the FOUP body 42 and the base 21 (the window unit 214).

The second seal portion 6 is provided so as to go around the opening portion 21a in an area near the opening edge of the opening portion 21a on the rear surface 21B of the base 21. In the present embodiment that adopts the configuration in which the window unit 214 is attached to the base 21, the second seal portion 6 is caused to go around and attached to the rear surface 216B of the window frame part 216 at a position that faces the front surface of the load port door 22, i.e., the seal surface set on a predetermined portion of the front surface 21A of the base 21 (the surface set on the outer edge portion of the load port door 22). Then, when the load port door 22 is located at the closed position, the load port door 22 comes into contact with the rear surface 216B of the window frame part 216 via the second seal portion 6. The second seal portion 6 seals a gap between the peripheral edge of the opening portion 21a of the base 21 and the load port door 22 (see FIG. 9). As a result, in the state in which the load port door 22 is located at the closed position, it is possible to suppress the outflow of a gas from the transfer space 3S of the transfer chamber 3 to the outside GS of the transfer chamber 3 and the inflow of a gas from the outside GS of the transfer chamber 3 to the transfer space 3S of the transfer chamber 3. A thin-walled portion is set at the outer peripheral edge portion of the load port door 22. The central portion of the load port door 22 excluding the thin-walled portion is a thick-walled portion which is thicker than the thin-walled portion. The thick-walled portion is set to face the opening portion 21a (the opening portion 215) in such a form as to protrude forward from the opening portion 21a of the base 21 (the opening portion 215 of the window frame part 216).

In the present embodiment, O-rings having a substantially circular cross-sectional shape are used as the first seal portion 5 and the second seal portion 6. The O-ring constituting the first seal portion 5 is arranged over the upper side portion 5A, the lower side portion 5B and the left and right side portions 5C of the first seal portion 5. The O-ring constituting the second seal portion 6 is arranged over the upper side portion 6A, the lower side portion 6B and the left and right side portions 6C of the second seal portion 6.

Furthermore, the load port 2 of the present embodiment includes a movement-restraining part L that restrain the FOUP 4 on the mounting table 23 located at the docking position from moving away from the base 21 (forward). In the present embodiment, the movement-restraining part L is unitized as the window unit 214.

The movement-restraining part L is switchable between a movement-restraining state in which the FOUP 4 on the mounting table 23 located at the docking position is restrained from moving away from the base 21 (backward) and a movement-permitting state in which the FOUP 4 on the mounting table 23 located at the docking position is permitted to move away from the base 21. That is, when in the movement-restraining state, the movement-restraining part L can hold the FOUP 4 mounted on the mounting table 23 located at a predetermined docking position.

As shown in FIG. 11 and so forth, the movement-restraining part L according to the present embodiment includes an engagement piece L1 capable of engaging with the collar portion 45 provided in the portion of the FOUP body 42 around the FOUP door 43, and a retraction portion L2 for moving the engagement piece L1 toward the base 21 in a state in which the engagement piece L1 is engaged with the collar portion 45. Such a movement-restraining part L has a clamp function capable of holding the collar portion 45 of the FOUP body 42 in a state in a state in which the collar portion 45 is sandwiched between the engagement piece L1 and the base 21. In the present embodiment, the window unit 214 is provided on the base 21. Therefore, the movement-restraining part L has a function of sandwiching the collar portion 45 of the FOUP body 42 between the engagement piece L1 and the window frame part 216 of the window unit 214.

The engagement piece L1 is posture-changeable between a non-facing posture in which the entirety of the engagement piece L1 including a distal end does not face the FOUP 4 in the front-rear direction D, and a facing posture (the posture shown in FIG. 11) in which the engagement piece L1 faces the FOUP 4. In the load port 2 according to the present embodiment, by bringing the engagement piece L1 into the non-facing posture, it is possible to move the mounting table 23 supporting the FOUP 4 between a predetermined docking position where the FOUP door 43 approaches the opening portion 215 and a position spaced apart from the transfer chamber 3 by a predetermined distance with respect to the docking position. That is, the movement-restraining part L comes into the movement-permitting state by bringing the engagement piece L1 into the non-facing posture.

Figure 8:
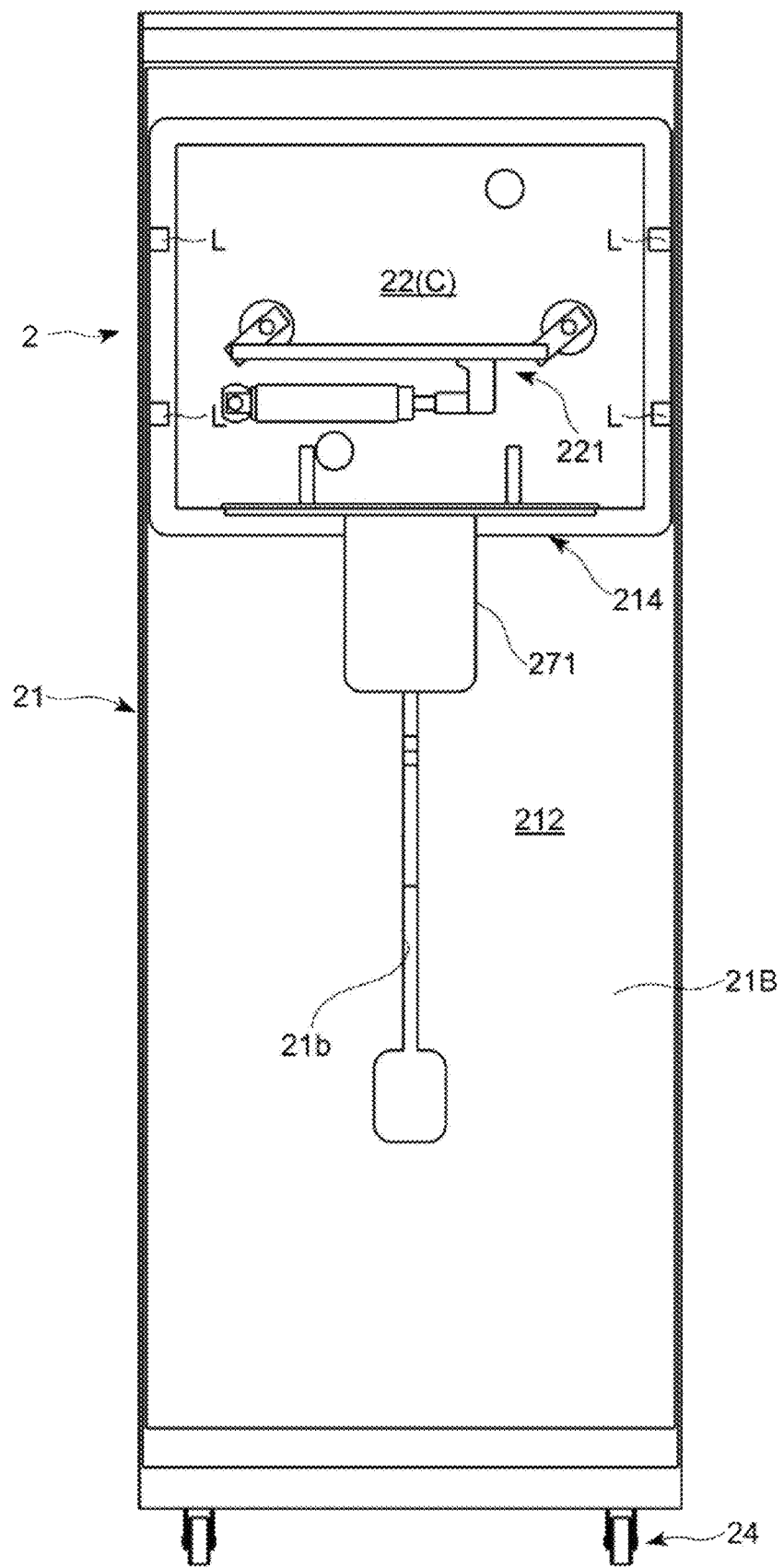
FIG. 8 is a view seen in a y-direction in FIG. 6.

In a state in which the engagement piece L1 is brought into the non-facing posture, after the mounting table 23 located in an undocking position is moved to docking position while supporting the FOUP 4, the movement-restraining part L moves the engagement piece L1 kept in the non-facing posture in such a direction as to retract the engagement piece L1 toward the transfer chamber 3, thereby changing the posture of the engagement piece L1 from the non-facing posture to the facing posture. As a result, the engagement piece L1 can be brought into engagement with the collar portion 45 protruding outward on the rear surface 42B of the FOUP body 42. Then, by retracting the engagement piece L1 toward the transfer chamber 3 with the retraction portion L2, the engagement piece L1 is retracted toward the transfer chamber 3 (backward) while maintaining the engagement state of the engagement piece L1 and the collar portion 45 of the FOUP 4. As a result, the collar portion 45 of the FOUP 4 is sandwiched between the engagement piece L1 and the base 21. This makes it possible to restrain the FOUP 4 on the mounting table 23 located at the docking position from moving away from the base 21. That is, the movement-restraining part L comes into the movement-restraining state (the state shown in FIG. 11) by changing the posture of the engagement piece L1 from the non-facing posture to the facing posture and retracting the engagement piece L1 toward the base 21 by the retraction portion L2. As shown in FIGS. 2 and 8, the movement-restraining parts L having such a configuration are disposed at four locations in total near the upper end and the lower end on both sides of the substantially rectangular opening portion 21a of the base 21.

In the present embodiment, as shown in FIG. 9, the rear surface 42B of the FOUP body 42 of the FOUP 4 mounted on the mounting table 23 located at the docking position comes close to the front surface 21A of the base 21 (the front surface 216A of the window frame part 216) with a gap of a predetermined dimension left therebetween. The gap can be sealed by the first seal portion 5. Furthermore, in the load port 2 of the present embodiment, when the load port door 22 comes into the closed state after the mounting table 23 is located at the predetermined docking position, the FOUP door 43 and the load port door 22 come close to each other with a gap of a predetermined dimension left therebetween. The gap between the load port door 22 and the base 21 can be sealed by the second seal portion 6. Accordingly, the space where the load port door 22 and the FOUP door 43 face each other with a gap of a predetermined dimension left therebetween is a sealed space DS partitioned by the first seal portion 5 and the second seal portion 6.

As shown in FIGS. 2, 9 and so forth, the load port door 22 according to the present embodiment includes a gas injection part 71 for injecting a gas into the sealed space DS and a gas discharge part 72 for exhausting the gas present in the sealed space DS. The gas injection part 71 is configured by using, for example, a long nozzle. One end (downstream end in the gas injection direction) of the nozzle is caused to reach the outer surface of the load port door 22, and a gas injection valve 71a is connected to the vicinity of the other end (upstream end in the gas injection direction) of the nozzle. Similarly, the gas discharge part 72 is configured by using, for example, a nozzle. One end (upstream end in the gas discharge direction) of the nozzle is caused to reach the outer surface of the load port door 22, and a gas discharge valve 72a is connected to the vicinity of the other end (downstream end in the gas discharge direction) of the nozzle. With such a configuration, the gas injection part 71 supplies an environmental gas (nitrogen gas in the present embodiment) to the sealed space DS, and the gas discharge part 72 exhausts the gas present in the sealed space DS, which makes it possible to purge the sealed space DS. Hereinafter, such a gas purge process in which the sealed space DS where the FOUP door 43 and the load port door 22 face each other with a predetermined gap left therebetween is replaced with the gas will be referred to as "door purge process." In the present embodiment, the differential pressure between the sealed space DS and the outside GS (atmospheric pressure) is set to, for example, 500 Pa (G) or lower, preferably 300 Pa (G) or lower, by the door purge process.

As shown in FIG. 2, the upstream end of the gas injection part 71 in the gas injection direction, the gas injection valve 71a, the downstream end of the gas discharge part 72 in the gas discharge direction and the gas discharge valve 72a are covered by the cover 28 described above. A predetermined portion of each of the nozzles constituting the gas injection part 71 and the gas discharge part 72 penetrates the load port door 22 in the thickness direction (the front-rear direction D). An appropriate sealing treatment is applied to the portion of the load port door 22 penetrated by the nozzle. In the present embodiment, a nozzle excellent in flexibility or stretchability (including a bellows type) is used as the nozzle. A tube may be substituted for a part or all of the nozzles. In FIG. 2 and so forth, the portions of the gas injection part 71 and the gas discharge part 72 exposed to the transfer space 3S are actually accommodated in a door cover (not shown) that covers the load port door 22 from the side of the transfer chamber 3.

The load port 2 of the present embodiment includes a purge device P capable of injecting a purge gas into the internal space 4S of the FOUP 4 and replacing the gas atmosphere of the internal space 4S of the FOUP 4 with an environmental gas (purge gas) such as a nitrogen gas or the like (see FIG. 6). The purge device P includes a plurality of purge nozzle units 9 (gas supply/exhaust devices) disposed at predetermined positions on the mounting table 23 in a state in which the upper end portions thereof can be exposed. The purge nozzle units 9 are attached at appropriate positions on the mounting table 23 in conformity with the positions of the ports 40 provided on the bottom surface of the FOUP 4 and can be connected to the ports 40 in a state in which they are in contact with the port 40. In this regard, the purge nozzle units 9 correspond to "exhaust nozzle units" for supplying and exhausting an environmental gas according to the present disclosure.

As shown in FIGS. 3 to 5, 13 and 14, the purge nozzle unit 9 includes a nozzle 91, a housing 92 for holding the nozzle 91 so as to be movable up and down, and an expandable/contractible operation adjustment space 93 provided over the housing 92 and the nozzle 91 to operate the nozzle 91 between a standby posture (N3) and a use posture (N1). The standby posture (N3) of the nozzle 91 is the posture shown in FIGS. 3 and 13, i.e., the posture for bringing the port 40 into a closed state. The use posture (N1) of the nozzle 91 is the posture shown in FIGS. 5 and 14, i.e., the posture for bringing the port 40 into an open state.

The housing 92 includes a housing body 921 having a substantially rectangular parallelepiped shape, an inward protruding portion 922 protruding more inward than other regions on the inner wall of the housing body 921, and a nozzle control gas port 923 (see FIG. 13) which penetrates from the outer wall to the inner wall of the housing body 921 and which can carry a nozzle control gas (compressed air) into and out of the operation adjustment space 93. The nozzle control gas port 923 communicates with an operation adjustment space 93 formed between the housing 92 and the nozzle 91. An O-ring 924 (packing) that forms an airtight state by making elastic contact with the outer circumferential surface of the nozzle 91 at a predetermined location of the housing body 921 is provided in a state in which the O-ring 924 is fitted to a recessed portion.

The nozzle 91 includes a substantially cylindrical first nozzle 911 making contact with the port 40, and a second nozzle 912 disposed in the internal space of the first nozzle 911 and capable of pressing the valve 403 of the port 40.

The first nozzle 911 has a substantially cylindrical shape and includes a contact surface 914 formed at the upper end thereof and capable of making close contact with the downward surface of the port 40 (the downward surface of the base 401). In the predetermined regions of the outer circumferential wall of the first nozzle 911, a large diameter portion 915 which makes sliding contact with the inner wall of the housing 92, a stepped portion 916 which makes contact with an inward protruding portion 922 of the housing 92 to define a lowermost position of the first nozzle 911 and a small diameter portion 917 which makes sliding contact with the inward protruding portion 922 of the housing 92 are formed in these order along the height direction. In addition, an inward protruding portion 918 protruding more inward than other portions to define the lowermost position of the second nozzle 912 with respect to the first nozzle 911 is provided in a predetermined region of the outer circumferential wall of the first nozzle 911. An O-ring 919 (packing) which forms an airtight state by making elastic contact with the outer circumferential wall of the second nozzle 912 is provided in the inward protruding portion 918 in a state in which the O-ring 919 is fitted to a recessed portion. By bringing the contact surface 914 of the first nozzle 911 into close contact with the downward surface of the port 40, it is possible to prevent the gas present in the FOUP 4 from flowing out from the gap between the port 40 and the nozzle 91 to the outside GS when the port 40 is in an open state (see FIGS. 4 and 5).

The second nozzle 912 includes a second nozzle body 91a having a first gas flow path 91A penetrating an axial center portion in the height direction, and a nozzle base 91b assembled to the lower end portion of the second nozzle body 91a and having a second gas flow path 91B communicating with the first gas flow path 91A. On the outer wall of the nozzle base 91b, there is formed a purge gas port 91c through which a purge gas (nitrogen gas) can be caused to flow into and out of the first gas flow path 91A and the second gas flow path 91B. The nozzle base 91b is disposed in a posture in which the second gas flow path 91B extends in a substantially horizontal direction. The purge gas introduced from the purge gas port 91c to the second gas flow path 91B flows from the second gas flow path 91B to the first gas flow path 91A and is discharged from a gas discharge port 91d formed at the upper end portion of the second nozzle body 91a.

The upper end surface of the second nozzle 912 (the upper end surface of the second nozzle body 91a) serves as a pressing surface 91e that can make contact with or press the port 40 of the FOUP 4 to open the check valve 403 disposed inside the port 40. The gas discharge port 91d of the present embodiment is formed by a slit extending a predetermined distance from the pressing surface 91e toward the lower end side. In the present embodiment, a plurality of gas discharge ports 91d (slits) is formed at a predetermined pitch along the circumferential direction at the upper end portion of the second nozzle body 91a. The gas discharge port 91d serves as an injection port for introducing a purge gas (nitrogen gas) into the FOUP 4.

In the present embodiment, the second nozzle 912 is configured to be movable up and down relative to the first nozzle 911 in a state in which a predetermined region including at least the upper end portion of the second nozzle body 91a is accommodated in the internal space of the first nozzle 911. In a predetermined region of the outer circumferential wall of the second nozzle 912 accommodated in the internal space of the first nozzle 911, a large diameter portion 91f protruding more outward than other portions and making sliding contact with the inner circumferential wall of the first nozzle 911, a stepped portion 91g configured to define the lowermost position of the second nozzle 912 by making contact with the inward protruding portion 918 of the first nozzle 911, and a small diameter portion 91h making sliding contact with the inward protruding portion 918 of the first nozzle 911 are formed in this order in the height direction. In addition, an O-ring 91i (packing) which forms an airtight state by making elastic contact with the inner circumferential wall of the first nozzle 911 is provided in the large diameter portion 91f of the second nozzle 912 in a state in which the O-ring 91i is fitted to a recessed portion.

The relative position of the first gas flow path 91A formed in the second nozzle body 91a and the second gas flow path 91B formed in the nozzle base 91b may be changeable. However, in the present embodiment, the relative position of the first gas flow path 91A and the second gas flow path 91B is fixed.

The operation adjustment space 93 includes a first operation adjustment space 931 formed between the housing 92 and the first nozzle 911, and a second operation adjustment space 932 formed between the first nozzle 911 and the second nozzle 912.

The first operation adjustment space 931 is an expandable/contractible space in which the first nozzle 911 is operated between a posture shown in FIG. 3, i.e., a spaced-apart posture (P2) in which the first nozzle 911 is spaced apart from the port 40 and a posture shown in FIGS. 4 and 5, i.e., a close contact posture (P1) in which the first nozzle 911 brought into close contact with the port 40. In the present embodiment, a small space in which at least the stepped portion 916 of the outer circumferential wall of the first nozzle 911 and the inner circumferential wall of the housing 92 face each other in the radial direction of the first nozzle 911 with a predetermined gap left therebetween is set as the first operation adjustment space 931. When the first nozzle 911 is in the spaced-apart posture (P2), the first operation adjustment space 931 becomes a smallest space (see FIG. 3). In the process in which the first nozzle 911 is switched from the spaced-apart posture (P2) to the close contact posture (P1), the first operation adjustment space 931 is gradually enlarged at least in the height direction. When the first nozzle 911 is in the close contact posture (P1), the first operation adjustment space 931 becomes a largest space (see FIGS. 4 and 5).

That is, when the nozzle control gas (compressed air in the present embodiment) is introduced from the nozzle control gas port 923 of the housing 92 in a state in which the nozzle control gas (compressed air in the present embodiment) is not introduced from the nozzle control gas port 923 of the housing 92 and the first nozzle 911 is in the spaced-apart posture (P2), the first operation adjustment space 931 is expanded at least in the height direction according to the introduction amount (supply amount) of the nozzle control gas, whereby the first nozzle 911 is moved upward and switched to the close contact posture (P1). At the lower end portion of the first nozzle 911, there is provided a first nozzle stopper 929 for restraining the further upward movement of the first nozzle 911 by making contact with the housing 92 when the first nozzle 911 is in the close contact posture (P1).

Furthermore, when the nozzle control gas (compressed air in the present embodiment) present in the first operation adjustment space 931 is discharged from the nozzle control gas port 923 of the housing 92 in a state in which the first nozzle 911 is in the close contact posture (P1), the first operation adjustment space 931 is contracted at least in the height direction, whereby the first nozzle 911 is moved downward and switched to the spaced-apart posture (P2). In the spaced-apart posture (P2), the stepped portion 916 of the first nozzle 911 makes contact with the inward protruding portion 922 of the housing 92 to define the lowermost position of the first nozzle 911. This makes it possible to appropriately maintain the spaced-apart posture (P2).

The second operation adjustment space 932 is an expandable/contractible space in which the second nozzle 912 is operated between a posture shown in FIGS. 5, i.e., a pressing posture (Q1) in which the second nozzle 912 presses the valve 403 of the port 40 to open the port 40 and a posture shown in FIGS. 3 and 4, i.e., a spaced-apart posture (Q2) in which the second nozzle 912 is spaced apart from the valve 403 of the port 40 to close the port 40. In the present embodiment, a small space in which at least the stepped portion 91g of the outer circumferential wall of the second nozzle 912 and the inner circumferential wall of the first nozzle 911 face each other in the radial direction of the second nozzle 912 with a predetermined gap left therebetween is set as the second operation adjustment space 932. When the second nozzle 912 is in the spaced-apart posture (Q2), the second operation adjustment space 932 becomes a smallest space (see FIGS. 3 and 4). In the process in which the second nozzle 912 is switched from the spaced-apart posture (Q2) to the pressing posture (Q1), the second operation adjustment space 932 is gradually expanded at least in the height direction. When the second nozzle 912 is in the pressing posture (Q1), the second operation adjustment space 932 becomes a largest space (see FIG. 5).

The purge nozzle unit 9 according to the present embodiment includes a communication path 933 for bringing the first operation adjustment space 931 and the second operation adjustment space 932 into communication with each other. The communication path 933 is formed at a predetermined location in the first nozzle 911 by a through-hole extending in the radial direction of the first nozzle 911 as shown by a broken line in FIGS. 3 to 5. The location where the communication path 933 is formed in the first nozzle 911 may be one location or may be a plurality of locations (a configuration in which communication paths 933 are formed at a predetermined pitch in the circumferential direction of the first nozzle 911).

With the configuration having such a communication path 933, the nozzle control gas can be introduced into the first operation adjustment space 931 from the nozzle control gas port 923 of the housing 92 and can also be introduced into the second operation adjustment space 932 via the communication path 933. In particular, according to the present embodiment, by introducing the nozzle control gas into the first operation adjustment space 931 from the nozzle control gas port 923 of the housing 92, the first nozzle 911 is first moved upward and switched from the spaced-apart posture (P2) to the close contact posture (P1). Then, the second nozzle 912 is moved upward and switched from the spaced-apart posture (Q2) to the pressing posture (Q1).

In addition, each of the first operation adjustment space 931 and the second operation adjustment space 932 can restore its original size (the size before expansion) by removing (exhausting) the compressed air as a nozzle control gas introduced into the first operation adjustment space 931 and the second operation adjustment space 932. The first nozzle 911 in the close contact posture (P1) can be moved downward to take the spaced-apart posture (P2), and the second nozzle 912 in the pressing posture (Q1) can be moved downward to take the spaced-apart posture (Q2).

Figure 13:
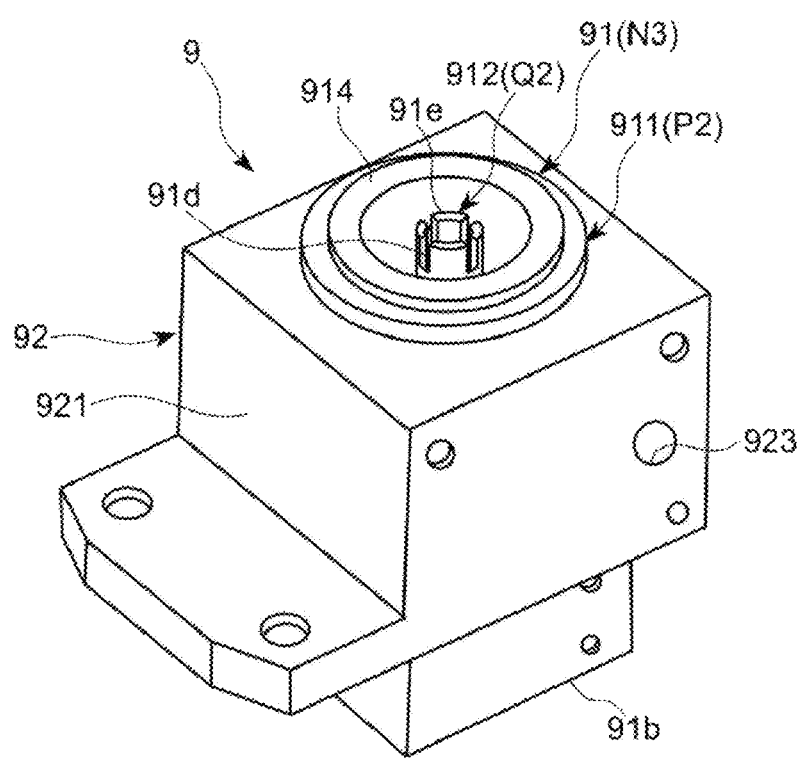
FIG. 13 is an overall external view of an exhaust nozzle unit in which the nozzle is in a standby posture in the embodiment.
Figure 14:
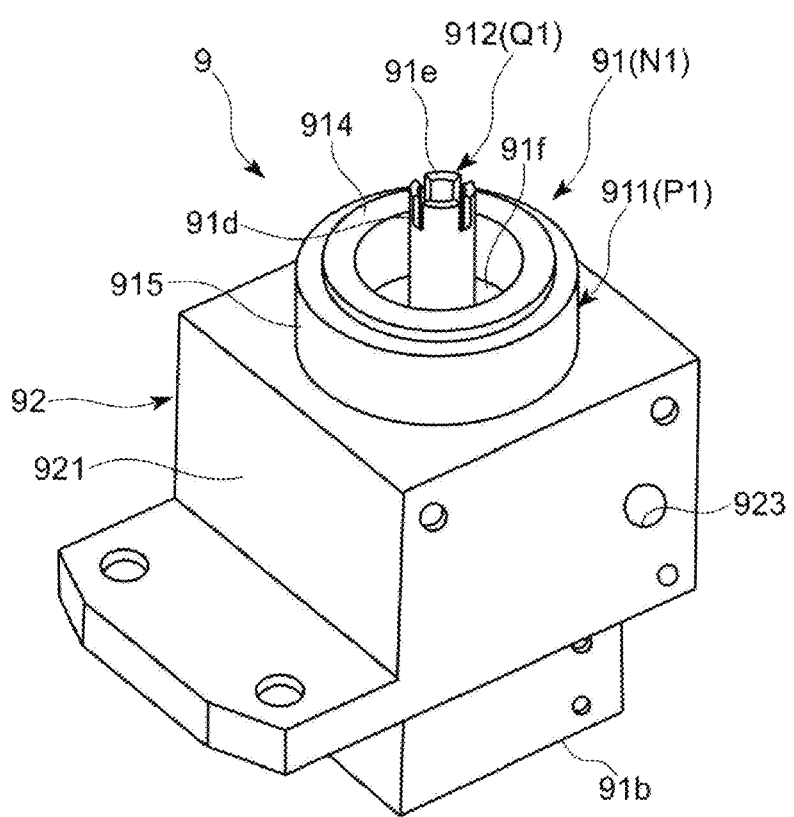
FIG. 14 is an overall external view of the exhaust nozzle unit in which the nozzle is in a use posture in the embodiment.

Accordingly, by carrying out the process of taking the compressed air into and out of the operation adjustment space 93, the purge nozzle unit 9 according to the present embodiment can switch the nozzle 91, step by step, from the standby posture (N3) shown in FIGS. 3 and 13 to the use posture (N1) shown in FIGS. 5 and 14 via the intermediate posture (N2) shown in FIG. 4. In this regard, the standby posture (N3) of the nozzle 91 refers to a posture in which both the first nozzle 911 and the second nozzle 912 are in the spaced-apart posture (P2 or Q2). Furthermore, the intermediate posture (N2) of the nozzle 91 refers to a posture in which the first nozzle 911 is in the close contact posture (P1) and the second nozzle 912 is in the spaced-apart posture (Q2). The use posture (N1) of the nozzle 91 refers to a posture in which the first nozzle 911 is in the close contact posture (P1) and the second nozzle 912 is in the pressing posture (Q1). When the nozzle 91 is in the standby posture (N3) and the intermediate posture (N2), the closed state of the port 40 is maintained. When the nozzle 91 is in the use posture (N1), the pressing surface 91e of the second nozzle 912 pushes up the port 40, whereby the port 40 comes into an open state.

Furthermore, when the nozzle 91 is in the use posture (N1), if the compressed air introduced into the operation adjustment space 93 is exhausted, the nozzle 91 returns to the standby posture (N3) via the intermediate posture (N2). That is, according to the present embodiment, the first nozzle 911 and the second nozzle 912 constituting the nozzle 91 can be individually moved up and down by injecting and discharging the nozzle control gas (compressed air).

The purge nozzle unit 9 according to the present embodiment described above in detail can be attached to a plurality of predetermined locations (in the present embodiment, the vicinity of four corners of the mounting table 23 as shown in FIG. 6) of the mounting table 23 of the load port 2 in a unitized state using the attachment holes formed at appropriate locations in the housing 92. The plurality of purge nozzle units 9 serves as parts of the purge device P capable of replacing the gas atmosphere in the FOUP 4 mounted on the mounting table 23 with a purge gas.

In the load port 2 of the present embodiment, when the FOUP 4 is not mounted on the mounting table 23, each purge nozzle unit 9 is positioned below the upper surface of the mounting table 23. Then, when it is detected that the bottom surface portion of the FOUP 4 presses, for example, the pressed portion of a pressure sensor provided on the mounting table 23, each purge nozzle unit 9 is advanced upward by a signal from the controller 2C. In other words, the nozzle 91 is switched from the standby posture (N3) to the intermediate posture (N2) so as to make contact with the port 40 (the inlet port or the outlet port) of the FOUP 4. Then, by switching the nozzle 91 from the intermediate posture (N2) to the use posture (N1), each port 40 is switched from the closed state to the open state.

According to the present embodiment, in the bottom purge process using such a purge device P, the purge nozzle unit 9(S) connected to the port 40 provided at a position relatively close to the opening portion 21a of the base 21 among the plurality of ports 40 provided at the bottom portion of the FOUP 4 is caused to function as a "supply nozzle," and the purge nozzle unit 9(V) connected to the port 40 provided at a position relatively far from the opening portion 21a of the base 21 is caused to function as an "exhaust nozzle" (see FIGS. 1 and 2). That is, in the "bottom purge process" according to the present embodiment, an environmental gas (also referred to as a purge gas) (a nitrogen gas or a dry air mainly used as the environmental gas), which is an appropriately selected gas such as a nitrogen gas, an inert gas, a dry air or the like, is injected into the FOUP 4 from the position on the front side of the bottom surface of the FOUP 4 (hereinafter referred to as "front side") close to the loading/unloading opening 41 in the internal space 4S of the FOUP 4, and a gas atmosphere present in the FOUP 4 is discharged from the position on the back side of the bottom surface of the FOUP 4 (hereinafter referred to as "back side") far from the loading/unloading opening 41 in the internal space 4S of the FOUP 4, whereby the FOUP 4 is filled with the purge gas. Accordingly, during the bottom purge process, a gas flow moving from the front side to the back side is formed in the FOUP 4.

The load port 2 configured as described above executes a predetermined operation as a drive command is given to each part or unit from the controller 2C. In the EFEM 1 of the present embodiment, a plurality of (for example, three) load ports 2 as described above are arranged on the front wall surface 3A of the transfer chamber 3.

As shown in FIG. 1, the EFEM 1 mainly includes the load port 2 and the transfer chamber 3 provided in mutually adjacent positions in a common clean room. The operation of the EFEM 1 is controlled by the controller of the load port 2 (the controller 2C shown in FIG. 6) or the controller of the entire EFEM 1 (the controller 3C shown in FIG. 1).

For example, a processing apparatus M (semiconductor processing apparatus) is provided adjacent to the rear wall surface 3B of the transfer chamber 3 facing the front wall surface 3A on which the load port 2 is disposed. In the clean room, the internal space MS of the processing apparatus M, the transfer space 3S of the transfer chamber 3 and the internal space 4S of the FOUP 4 mounted on the load port 2 are maintained at high cleanliness. On the other hand, the space where the load port 2 is disposed, i.e., the outside of the processing apparatus M and the outside of the EFEM 1 are maintained at relatively low cleanliness. FIG. 1 is a side view schematically showing the relative positional relationship between the load port 2 and the transfer chamber 3, and the relative positional relationship between the EFEM 1, which includes the load port 2 and the transfer chamber 3, and the processing apparatus M.

The processing apparatus M includes a load lock chamber disposed at a position relatively close to the transfer chamber 3 and a processing apparatus body disposed at a position relatively far from the transfer chamber 3. In the present embodiment, as shown in FIG. 1, the load port 2, the transfer chamber 3 and the processing apparatus M are disposed in close contact with each other in this order in the front-rear direction D of the EFEM 1. The operation of the processing apparatus M is controlled by the controller (the controller MC shown in FIG. 1) of the processing apparatus M. In this regard, the controller MC, which is a controller of the entire processing apparatus M, and the controller 3C, which is a controller of the entire EFEM 1, are higher-level controllers of the controller 2C of the load port 2.

The transfer chamber 3 includes a transfer robot 31 provided in the transfer space 3S thereof and capable of transferring the wafer W, which is a transfer target object, between the FOUP 4 and the processing apparatus M. For example, the transport robot 31 includes an arm configured to connect a plurality of link elements to each other in a horizontally swingable manner and provided with a hand at the distal end portion thereof, and a running part configured to support an arm base constituting the base end portion of the arm in a swingable manner and configured to run in the width direction of transfer chamber 3 (in the parallel arrangement direction of the load ports 2). The transfer robot 31 has a link structure (multi joint structure) whose shape is changed between a folded state in which the arm length is minimized and an extended state in which the arm length is longer than that in the folded state. It is also possible to configure an EFEM 1 in which one or both of a buffer station and an aligner are disposed on the side surface of the transfer chamber 3.

By connecting the load port 2 and the processing apparatus M, the transfer chamber 3 comes into a state in which the transfer space 3S is substantially sealed. In the transfer chamber 3, it is possible to increase the environmental gas concentration by performing a purge process with an environmental gas (for example, a nitrogen gas or an inert gas) using a gas supply port and a gas discharge port (not shown). Then, a fan filter unit 32 is provided in the upper part of the wafer transfer chamber 3 to send a gas downward, and the gas is sucked by a chemical filter provided in the lower part. The sucked gas is returned to the upper fan filter unit 32 through a circulation duct 321. In this way, there is formed a down-flow (descending gas flow), which is a gas flow moving from the upper side to the lower side in the transfer space 3S of the transfer chamber 3. Therefore, the environmental gas present in the transfer chamber 3 can be circulated and maintained in a clean state. In addition, even if particles that may contaminate the surface of the wafer W exist in the transfer space 3S of the transfer chamber 3, the particles can be pushed downward by the down-flow, thereby suppressing adhesion of the particles to the surface of the wafer W under transfer. In FIG. 1, the flow of gas formed by the fan filter unit 32 is schematically shown by arrows.

The load port 2 of the present embodiment executes a predetermined operation as a drive command is given to each part or unit from the controller 2C. In the present embodiment, the controller 2C of the load port 2 is configured to give a drive command to each par or unit. The controller 2C is formed of an ordinary microprocessor or the like including a CPU, a memory and an interface. Programs necessary for processing are stored in advance in the memory. The CPU sequentially fetches and executes the necessary programs. The CPU cooperates with peripheral hard resources to realize a desired function.

Next, the operation flow of the EFEM 1 will be described together with the use method and operation of the EFEM 1.

First, the FOUP 4 is transferred up to the upper side of the load port 2 by a container transfer device such as an OHT or the like operated on a straight transfer line (moving line) extending along the common front wall surface 3A of the transfer chamber 3 where the load port 2 is disposed. The FOUP 4 is mounted on the mounting table 23. At this time, for example, the positioning protrusions 231 provided on the mounting table 23 are fitted into the positioning recesses of the FOUP 4. In addition, the controller 2C brings the locking claw 232 on the mounting table 23 into a locked state (locking process). Specifically, the locking claw 232 on the mounting table 23 is hooked and fixed to the locked portion (not shown) provided on the bottom surface of the FOUP 4, whereby the locking claw 232 comes into a locked state. Thus, the FOUP 4 can be mounted and fixed at a predetermined regular position on the mounting table 23. In the present embodiment, the FOUPs 4 can be mounted on the mounting tables 23 of the three load ports 2 arranged side by side in the width direction of the transfer chamber 3. In addition, it may also be possible to adopt a configuration in which the mounting of the FOUP 4 at the regular position on the mounting table 23 is detected by a seating sensor (not shown) for detecting whether or not the FOUP 4 is mounted at a predetermined position on the mounting table 23.

In the present embodiment, by driving the fan filter unit 32 provided in the transfer chamber 3, a descending gas flow is generated in the transfer space 3S of the transfer chamber 3, and a gas (environmental gas) having high cleanliness is circulated in the transfer space 3S.

Next, in the load port 2 of the present embodiment, the controller 2C moves the mounting table 23 existing at the position shown in FIG. 2 to the docking position shown in FIG. 9 (docking process). That is, the mounting table 23 existing at the position shown in FIG. 2 is moved toward the base 21, whereby the rear surface of the FOUP 4 (the rear surface 42B of the FOUP body 42 and the outward surface of the FOUP door 43 facing each other) is brought to a position spaced apart by a predetermined distance from the base front surface 21A of the base 21 closest to the FOUP body 42 at the peripheral edge of the opening portion 21a. Until the docking process is performed, the movement-restraining part L is maintained in the movement-permitting state in which the engagement piece L1 is kept in the non-facing posture. The surface indicated by reference numeral 21B in FIG. 2 and so forth is the base rearmost surface of the base 21 farthest from the FOUP body 42 at the peripheral edge of the opening portion 21a (the opening portion 215 of the window frame part 216).

Then, when the mounting table 23 is moved to a predetermined docking position, the controller 2C of the load port 2 in the present embodiment performs a process of holding and fixing at least both sides of the FOUP 4 using the movement-restraining part L. Specifically, the engaging piece L1 is retracted toward the base 21 by the retraction portion L2 of the movement-restraining part L. Then, the engagement piece L1 is switched from the non-facing posture to the facing posture and is engaged with the collar portion 45 of the FOUP body 42. In this state, the collar portion 45 of the FOUP 4 on the mounting table 23 located at the docking position can be sandwiched between the engagement piece L1 of the movement-restraining part L and the base front surface 21A (the front surface 216A of the window frame part 216). That is, the container-clamping process can be realized by a process of switching the movement-restraining part L from the movement-permitting state to the movement-restraining state.

The timing at which the movement-restraining part L is switched from the movement-permitting state to the movement-restraining state may be any timing after the time at which the mounting table 23 is located at the docking position. It may be possible to adopt a configuration in which the movement-restraining part L is switched from the movement-permitting state to the movement-restraining state immediately after the mounting table 23 is located at the docking position. Furthermore, it may be possible to adopt a configuration in which the movement-restraining part L is switched from the movement-permitting state to the movement-restraining state after a predetermined time has elapsed since the locating of the mounting table 23 at the docking position.

In the load port 2 of the present embodiment, when the container-clamping process is finished, the rear surface 42B of the FOUP body 42 set as a seal surface in the FOUP 4 mounted on the mounting table 23 located at the docking position makes elastic contact with the first seal portion 5 of the base 21 in the vicinity of the opening portion 21a of the base 21 (the opening portion 215 of the window frame part 216). A good seal region can be formed between the FOUP 4 and the base 21 by the elastic deformation of the first seal portion 5. That is, in the load port 2 of the present embodiment, by performing the container-clamping process, it is possible to simultaneously perform the process (sealing process) for forming a good seal region between the FOUP 4 and the base 21. In the load port 2 of the present embodiment, by going through the container-clamping process, it is possible to maintain a state in which the FOUP 4 mounted on the mounting table 23 located at the docking position is fixed by the movement-restraining part L. Therefore, it is possible to prevent a situation that the FOUP 4 making elastic contact with the first seal portion 5 is moved away from the base 21 or tilted.

In the load port 2 of the present embodiment, after the container-clamping process and the sealing process, the controller 2C performs a process in which a nitrogen gas is supplied to the sealed space DS and the gas (atmosphere) remaining in the sealed space DS thus far is discharged by the gas discharge part 72 (door purge process). The door purge process is a process of injecting a nitrogen gas supplied from an appropriate gas supply source into the sealed space DS to replace the inside of the sealed space DS with the nitrogen gas. Specifically, the door purge process is a process in which a nitrogen gas is supplied from the gas injection part 71 to the sealed space DS by opening the door purge gas injection valve 71a and the gas (atmosphere) remaining in the sealed space DS thus far is discharged from the gas discharge part 72 by opening the door purge gas discharge valve 72a. In this regard, the atmosphere contains oxygen, moisture, particles, and the like that may change the properties of the wafer W by, for example, oxidizing the wafer W. If the inside of the FOUP door 43 is hollow and the internal space of the FOUP door 43 is configured to communicate with the sealed space DS through a hole (a door-holding hole, etc.) formed on the rear surface of the FOUP door 43, the internal space of the FOUP door 43 can be replaced with the nitrogen gas by the door purge process of the present embodiment. The gas injection operation of injecting the gas from the gas injection part 71 into the sealed space DS and the discharge operation of discharging the gas from the gas discharge part 72 into the sealed space DS may be repeated. The load port 2 of the present embodiment can maintain the sealed state of the first seal portion 5 and the second seal portion 6 even during the door purge process. In addition, it may be possible to set a portion (preferentially opened portion) so that when the sealed space DS is in a positive pressure state along with the door purge process, the seal state is released in at least one place of the first seal portion 5 by receiving a pressure that acts from the sealed space DS to the outside of the sealed space DS. In this case, by providing the exhaust unit in the vicinity of the preferentially opened portion (the place where the seal is broken) and under the atmospheric pressure GS which is the outside of the sealed space DS, it is possible for the exhaust unit to efficiently exhaust at least the gas such as the door purge gas or the like leaked from the preferentially opened portion to the outside of the sealed space DS. The exhaust unit may be omitted if the amount of the gas leaked to the outside of the sealed space DS through the preferentially opened portion is a trace amount (an amount that does not pose a danger to an operator).

In the load port 2 of the present embodiment, after the door purge process, the controller 2C switches the connection mechanism 221 to the lid connection state (lid connection process). By this process, the FOUP door 43 can be connected by the connection mechanism 221 to the load port door 22 which is kept waiting in the fully closed position (C) in advance, and can be held in a close contact state. Furthermore, the FOUP door 43 can be removed from the FOUP body 42. Moreover, in the load port 2 of the present embodiment, when the FOUP 4 is mounted at the regular position on the mounting table 23, the controller 2C detects that the bottom surface portion of the FOUP 4 presses, for example, the pressed portion of the pressure sensor provided on the mounting table 23. In response thereto, the controller 2C issues a drive command (signal) for advancing the purge nozzle unit 9 (all the purge nozzle units 9) provided on the mounting table 23 upward beyond the upper surface of the mounting table 23. Then, each purge nozzle unit 9 is switched from the stand-by posture (N3) to the use posture (N1) via the intermediate posture (N2) and is connected to each port 40 of the FOUP 4, whereby each port 40 is changed from the closed state to the open state. As described above, in the present embodiment, the purge nozzle unit 9(S) connected to the port 40 provided at a position relatively close to the opening portion 21a of the base 21 among the plurality of ports 40 provided at the bottom of the FOUP 4 is caused to serve as "supply nozzle", and the purge nozzle unit 9(V) connected to the port 40 provided at a position relatively far from the opening portion 21a of the base 21 is caused to serve as "exhaust nozzle." Thus, the nitrogen gas is supplied to the internal space 4S of the FOUP 4. The nitrogen gas forms a nitrogen gas flow which flows from the front side to the back side in the FOUP 4 to discharge the gas atmosphere existing in the FOUP 4, thereby replacing the internal space 4S of the FOUP 4 with the nitrogen gas. The water concentration and oxygen concentration in the FOUP 4 are respectively reduced to specific values or lower, whereby the surrounding environment of the wafer W in the FOUP 4 is set to a low humidity environment and a low oxygen environment (bottom purge process).

In the load port 2 of the present embodiment, after the lid connection process, the controller 2C executes a process (container-sealing release process) in which the FOUP door 43 is moved together with the load port door 22 to open the opening portion 21a of the base 21 and the loading/unloading opening 41 of the FOUP 4, thereby releasing the sealed state in the FOUP 4. Specifically, as shown in FIG. 10, the controller 2C moves the load port door 22 by the door-moving mechanism 27 from the fully closed position (C) toward the transfer chamber 3 in the internal space 4S of the FOUP 4 along the aforementioned horizontal path so as to reach the aforementioned open position (O). Furthermore, the controller 2C lowers the load port door 22 reached the open position (O) by a predetermined distance along the aforementioned vertical path to locate the load port door 22 at a fully opened position (not shown). At the time of executing the container-sealing release process, the sealed space DS and the internal space 4S of the FOUP 4 are filled with the nitrogen gas through the door purge process and the bottom purge process described above. Therefore, during the process of moving the load port door 22 toward the transfer space 3S of the transfer chamber 3, it is possible to prevent particles and the like adhering to the FOUP door 43 before the door purge process from swirling.

By the container-sealing release process, the internal space 4S of the FOUP body 42 and the transfer space 3S of the transfer chamber 3 are brought into communication with each other. The gas (environment gas) of the descending gas flow generated in the transfer space 3S is also kept clean. In this regard, when executing the container-sealing release process, if the volume (capacity) of the sealed space DS is increased, the sealed space DS tends to have a negative pressure and the air may enter the sealed space DS from the external space GS. Therefore, in the present embodiment, the container-sealing release process is executed in a state in which the sealed space DS has a positive pressure with respect to the external space GS. Specifically, the nitrogen gas is continuously supplied from the gas injection part 71 even at the time of executing the container-sealing release process. Thus, in the present embodiment, the container-sealing release process is performed at least in a state in which the sealed space DS is not under a negative pressure. Furthermore, in the container-sealing release process, it is preferable that the sealed space DS is opened to the transfer space 3S at the same degree of pressure. The differential pressure between the external space GS and the transfer space 3S is 3 to 500 Pa (G), preferably 5 to 100 Pa (G).

Figure 15:
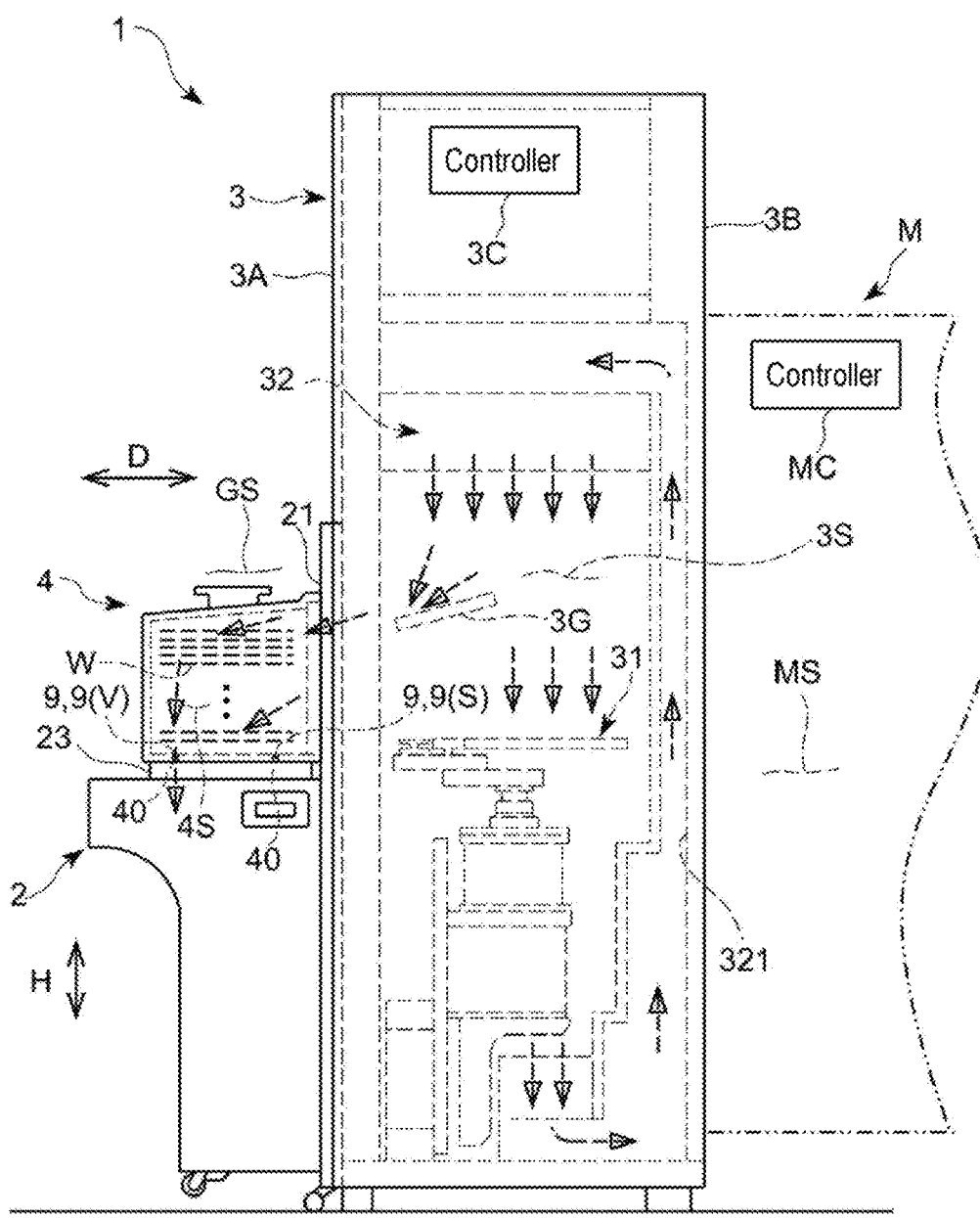
FIG. 15 is an explanatory view of an operation when the inside of the container is made clean using a descending gas flow in a transfer space according to the embodiment.

Then, in the EFEM 1 of the present embodiment, by executing the container-sealing release process, the internal space 4S of the FOUP body 42 and the transfer space 3S of the transfer chamber 3 are brought into communication with each other. As shown in FIG. 15, a part of the descending gas flow generated in the transfer space 3S flows into the internal space 4S of the FOUP body 42 via the opening portion 21a of the base 21 and the loading/unloading opening 41 of the FOUP 4. In this embodiment, immediately after or immediately before the container-sealing release process, at least the purge nozzle unit 9(V) functioning as an "exhaust nozzle" among the purge nozzle units 9 provided on mounting table 23 of load port 2, i.e., the purge nozzle unit 9(V) provided at a position relatively far from the opening portion 21a of the base 21, is set in the use posture (N1), whereby the port 40 connected to the purge nozzle unit 9(V) staying in the use posture (N1) among the ports 40 of the FOUP 4, i.e., the port 40 provided at a position relatively far from the opening portion 21a of the base 21, is brought into an open state. As a result, in the EFEM 1 of the present embodiment, the gas flowing from the inside of the transfer space 3S into the internal space 4S of the FOUP body 42 can be discharged from the port 40 provided at a position relatively far from the opening portion 21a of the base 21 among the ports 40 of the FOUP 4. Furthermore, by executing forced exhaust (suctioning the gas) with the purge nozzle unit 9(V) functioning as an "exhaust nozzle", it is possible to forcibly form a gas flow moving from the front side to the back side in the FOUP 4. In FIG. 15, the gas flows in the transfer chamber 3 and the FOUP 4 are schematically shown by arrows. One of the forced exhaust and the natural exhaust may be appropriately selected according to the processing content for the wafer W, the size and specifications of the wafer W, and the like.

The EFEM 1 according to the present embodiment executes a process in which a gas flow moving from the front side to the back side is formed in the FOUP 4 and a part of the descending gas flow generated in the transfer space 3S is distributed to the entire internal space of the FOUP 4 and discharged to the outside of the FOUP 4 from the purge nozzle unit 9(V) functioning as an exhaust nozzle (an in-container cleaning process using the descending gas flow in the transfer space 3S). As shown in FIG. 15, in the configuration provided with a guide plate 3G which guides a part of the descending gas flow generated in the transfer space 3S to the inside of the FOUP 4, compared with the configuration not provided with the guide plate 3G, it is possible to effectively introduce the descending gas flow of the transfer space 3S into the FOUP 4.

Furthermore, in the in-container cleaning process using the descending gas flow in the transfer space 3S, the purge nozzle unit 9(S) functioning as a "supply nozzle" among the purge nozzle units 9 provided on the mounting table 23 of the load port 2, i.e., the purge nozzle unit 9 provided at a position relatively close to the opening portion 21a of the base 21, may be set to the use posture (N1). The port 40 connected to the purge nozzle unit 9(S) staying in the use posture among the ports 40 of the FOUP 4, i.e., the port 40 provided at a position relatively close to the opening portion 21a of the base 21, may be maintained in an open state. An appropriate purge gas may be supplied from the purge nozzle unit 9(S) functioning as a supply nozzle into the FOUP 4. In this case, the purge gas may flow together with a part of the descending gas flow from the front side to the back side in the FOUP 4 and may be discharged from the purge nozzle unit 9(V) functioning as an exhaust nozzle.

Then, the EFEM 1 of the present embodiment executes a process in which, while continuously executing the in-container cleaning process using the descending gas flow in the transfer space 3S, the transfer robot 31 provided in the transfer space 3S of the transfer chamber 3 accesses the inside of the FOUP 4 and transfers the wafer W in a state in which the internal space 4S of the FOUP body 42 and the transfer space 3S of the transfer chamber 3 are brought into communication with each other (transfer process). The transfer-processing content that can be executed in the transfer process includes a process in which the transfer robot 31 takes out the wafer W existing in the FOUP 4 with the hand thereof, and process in which the processed wafer W subjected to appropriate processing by the processing apparatus M is put into the FOUP 4 with the hand thereof. For example, when the wafer W existing in the FOUP 4 is transferred into the transfer chamber 3 by the transfer process, the wafer W transferred into the transfer chamber 3 is transferred by the transfer robot 31 to the processing apparatus M (specifically, the load lock chamber), or to a buffer station or an aligner. In addition, the processed wafers W which have been appropriately processed by the processing apparatus M are directly stored in the internal space 4S of the FOUP 4 from the internal space MS of the processing apparatus M by the transfer robot 31, or sequentially stored in the internal space 4S of the FOUP 4 via the buffer station. In the load port 2 of the present embodiment, when the next access of the transfer robot 31 to the FOUP 4 is executed, the transfer process is repeatedly performed.

As described above, during the execution of the transfer process, the EFEM 1 of the present embodiment continuously executes the in-container cleaning process using the descending gas flow in the transfer space 3S, whereby the gas flow moving from the front side of the internal space 4S close to the loading/unloading opening 41 to the back side of the internal space 4S in the FOUP 4 can pass near the surface of the wafer W and the outgas released from the processed wafer W can be discharged to the outside of the FOUP 4. As a result, it is possible to prevent or suppress a situation where the wafer W existing in the FOUP 4 is oxidized or contaminated by the outgas generated from the processed wafer W1. In particular, by arranging the guide portion (guide plate 3G) for guiding a part of the descending gas flow of the transfer space 3S toward the FOUP 4 in the transfer chamber 3, it is possible to smoothly and efficiently introduce the environmental gas into the FOUP 4.

In the load port 2 according to the present embodiment, when all the wafers W existing in the FOUP 4 have been processed by the processing apparatus M, the controller 2C executes a process (container-sealing process) in which the load port door 22 is moved to the fully closed position (C) by the door-moving mechanism 27 to close the opening portion 21a of the base 21 and the loading/unloading opening 41 of the FOUP 4 and to seal the internal space 4S of the FOUP 4. Subsequently, the controller 2C executes a process (lid connection release process) in which the connection mechanism 221 is switched from the lid connection state to the lid connection release state. By virtue of this process, the connection state (lid connection state) of the load port door 22 and the FOUP door 43 connected by the connection mechanism 221 can be released so that the FOUP door 43 can be attached to the FOUP body 42. As a result, the opening portion 21a of the base 21 and the loading/unloading opening 41 of the FOUP 4 are closed by the load port door 22 and the FOUP door 43, respectively, and the internal space 4S of the FOUP 4 is sealed.

In the load port 2 according to the present embodiment, when the door purge process is stopped, the pressure in the sealed space DS tends to decrease. However, in order to avoid the occurrence of a problem due to the failure to achieve the positive pressure state of the sealed space DS described above, it is important to maintain the positive pressure state of the sealed space DS.

Subsequently, in the load port 2 according to the present embodiment, the controller 2C performs a container-clamping release process of releasing the fixed state (clamped state) of the FOUP 4 achieved by the movement-restraining part L and then executes a process (docking release process) of moving the mounting table 23 away from the base 21. Thereafter, the controller 2C releases the state in which the FOUP 4 is locked by the locking claw 232 on the mounting table 23 (locking release process). Thus, the FOUP 4 storing the wafer W subjected to a predetermined process is delivered from the mounting table 23 of each load port 2 to the container transfer device and is transported to the next process.

In the configuration in which suction is performed by the purge nozzle unit 9(V) functioning as an exhaust nozzle during the in-container cleaning process using the descending gas flow in the transfer space 3S, the suction performed by the purge nozzle unit 9(V) functioning as an exhaust nozzle is stopped at an appropriate timing simultaneously with or after the container-sealing process. Furthermore, in the configuration in which the purge gas is supplied into the FOUP 4 from the purge nozzle unit 9(S) functioning as a supply nozzle in the in-container cleaning process using the descending gas flow in the transfer space 3S, the supply process of the purge gas is stopped at an appropriate timing simultaneously with or after the container-sealing process. Meanwhile, by continuously forming the descending gas flow in the transfer space 3S using a gas having a high degree of cleanliness, it is possible to maintain the high cleanness in the transfer space 3S. When the suction process by the purge nozzle unit 9(V) functioning as an exhaust nozzle is continuously executed, the inside of the FOUP 4 is brought into a negative pressure state or a state close to a negative pressure. By pressing the FOUP door 43 into the FOUP 4, it is possible to secure high sealability in the FOUP 4.

Furthermore, the timing at which the purge nozzle unit 9 staying in the use posture (N1) is switched to the intermediate posture (N2) or the standby posture (N3) via the intermediate posture (N2) may be any appropriate timing before the wafer W is delivered from the mounting table 23 of the load port 2 to the container transfer device.

As described above, the purge nozzle unit 9 (exhaust nozzle unit) according to the present embodiment includes a nozzle 91 capable of switching the port 40 from the closed state to the open state by pressing the valve 403 of the port 40 provided on the bottom surface of the FOUP 4 and a housing 92 for holding the nozzle 91 so as to be movable up and down. Therefore, the port 40 can be opened by switching the nozzle 91 from the standby posture (N3) to the use posture (N1).

Accordingly, it is possible to switch the port 40 from the closed state to the open state regardless of the pressure of the gas supplied from the purge nozzle unit 9. By connecting such a purge nozzle unit 9 to each port 40 provided on the bottom surface of the FOUP 4, the port 40 provided at a position (position on the back side) relatively far from the loading/unloading opening 41 of the FOUP 4 and conventionally configured to function as a supply port among the ports 40 can be forcibly opened regardless of the supply pressure of the gas. The port 40 can be caused to function as an exhaust port.

With the EFEM 1 according to the present embodiment in which the descending gas flow is formed in the transfer space 3S of the transfer chamber 3, the gas flow as a part of the descending gas flow flowing into the FOUP 4 can be discharged to the outside of the FOUP 4 through the port 40 provided at a position (position on the back side) relatively far from the loading/unloading opening 41 of the FOUP 4 and the purge nozzle unit 9(V) connected to the port 40. As compared with the configuration in which the gas flow is discharged to the outside of the FOUP 4 through the port 40 provided at a position (position on the front side) relatively close to the loading/unloading opening 41 of the FOUP 4 and the purge nozzle unit 9 connected to the port 40, the gas flow as a part of the descending gas flow formed in the transfer space 3S and introduced into the internal space 4S of the FOUP 4 can be caused to become a gas flow moving from the front side to the back side over the entire internal space 4S of the FOUP 4. It is possible to efficiently discharge the gas existing in the FOUP 4 (the gas containing the outgas released from the wafer W existing in the FOUP 4) to the outside of the FOUP 4.

Furthermore, in the present embodiment, when the gas existing in the FOUP 4 is sucked from the purge nozzle unit 9(V) and collected at a predetermined location in a state in which the purge nozzle unit 9(V) functioning as an "exhaust nozzle" is in the use posture (N1), i.e., in a state in which the valve 403 of the port 40 is pushed up by the nozzle 91 to allow the gas to pass therethrough, the collected gas can be reused as the gas that forms the descending gas flow in the transfer chamber 3. Although the reused gas contains an outgas, the reused gas can be cleaned by allowing the reused gas to circulate through a circulation duct 321 provided in the transfer chamber 3 and to pass through the fan filter unit 32. Thus, the outgas is removed.

Furthermore, in the EFEM 1 of the present embodiment, by replacing a pipe, it is possible to temporarily or continuously select the configuration in which a predetermined gas is supplied into the FOUP 4 through the port 40 provided at a position (rear position) relatively far from the loading/unloading opening 41 of the FOUP 4 and the purge nozzle unit 9 connected to the port 40 and in which the gas is exhausted to the outside of the FOUP 4 through the port 40 provided at a position (front position) relatively close to the loading/unloading opening 41 of the FOUP 4 and the purge nozzle unit 9 connected to the port 40.

As described above, according to the purge nozzle unit 9, the load port 2 and the EFEM 1 of the present embodiment, the existing FOUP 4 used at many manufacturing sites is used as it is, and then the gas introduced from the inside of the transfer space 3S into the FOUP 4 can be exhausted to the outside of the FOUP 4 through the port 40 existing on the back side among the plurality of ports 40 provided at the bottom of the FOUP 4.

In particular, in the present embodiment, the nozzle 91 includes the first nozzle 911 capable of coming into close contact with the outer edge of the port 40 and the second nozzle 912 for pressing the valve 403 of the port 40. Therefore, by opening the port 40 and bringing the first nozzle 911 into close contact with the port 40, it is possible to prevent the predetermined gas from leaking to the outside of the FOUP 4 through the gap between the port 40 and the nozzle 91. Accordingly, both the exhaust efficiency of the nozzle functioning as an exhaust nozzle and the supply efficiency of the nozzle functioning as a supply nozzle are improved.

In addition, the purge nozzle unit 9 according to the present embodiment adopts a configuration in which the nozzle 91 is operated between the standby posture (N3) and the use posture (N1) by taking the nozzle control gas into and out of the operation adjustment space 93. Accordingly, a dedicated drive mechanism for driving the nozzle 91 is unnecessary, and thus the operation of changing the posture of the nozzle 91 can be controlled with a simple configuration.

Furthermore, in the present embodiment, the first operation adjustment space 931 and the second operation adjustment space 932 are brought into communication with each other, and the nozzle control gas is taken into and out of the first operation adjustment space 931, whereby the second operation adjustment space 932 is also incidentally made expandable and contractible. Accordingly, the operations of the first nozzle 911 and the second nozzle 912 can be controlled with a simple configuration.

In the purge nozzle unit 9, the load port 2 and the EFEM 1 according to the present embodiment, the existing FOUP 4 used in many manufacturing sites is used as it is. The gas flow as a part of the descending gas flow formed in the transfer space 3S of the transfer chamber 3 and introduced into the FOUP 4 can be circulated throughout the internal space 4S of the FOUP 4 as a gas flow moving from the front side to the back side in the internal space 4S of the FOUP 4. There is no need to newly prepare a dedicated FOUP for forming such a gas flow. Thus, the purge nozzle unit 9, the load port 2 and the EFEM 1 according to the present embodiment can be easily introduced into the manufacturing site (manufacturing line).

Although the embodiment of the present disclosure has been described above, the present disclosure is not limited to the configuration of the above-described embodiment. For example, in the above-described embodiment, the compressed air has been illustrated as the gas introduced into the operation adjustment space. However, it may be possible to use an inert gas such as a nitrogen gas or the like, or a dry air.

Moreover, in the above-described embodiment, there has been described an example where the first nozzle and the second nozzle are provided as the nozzles of the exhaust nozzle unit and are configured to be individually movable up and down (two-step up/down movement). However, the nozzle may be configured so that the first nozzle and the second nozzle can be moved up and down simultaneously.

In addition, as the exhaust nozzle unit, it may be possible to adopt an exhaust nozzle unit that includes a second nozzle having an opening provided at a position spaced apart downward by a predetermined dimension from the pressing surface as the upper end surface so that the opening serves as a gas discharge port.

In the above-described embodiment, there has been illustrated an aspect in which the nozzle control gas port for introducing the nozzle control gas into the operation adjustment space is formed at only one location in the housing and in which the operation adjustment space and the nozzle control gas port are formed in a one-to-one relationship. However, it may be possible to adopt a configuration in which a plurality of nozzle control gas ports is formed to communicate with one operation adjustment space.

In the above-described embodiment, there has been illustrated an aspect in which the up/down movement of the nozzle is controlled only by the process of taking the nozzle control gas into and out of the nozzle control gas port. However, it may also be possible to adopt a configuration in which the nozzle can be switched between the standby posture and the use posture by elastically biasing the nozzle using an elastic body such as a spring or the like, or a configuration in which the nozzle can be switched between the standby posture and the use posture by an appropriate mechanism.

The nozzle may also be composed of a single nozzle body that cannot be distinguished between a first nozzle and a second nozzle. Moreover, it may also be possible to adopt a nozzle that can be distinguished between a first nozzle and a second nozzle and can be regarded as a single nozzle body by assembling the first nozzle and the second nozzle together. In these cases, the operation adjustment space formed between the nozzle and the housing may be one space which is not separated from each other.

Furthermore, it may be possible to adopt a purge nozzle unit in which the up/down movement of the nozzle with respect to the housing is realized by an electromagnetic method using an electromagnet. For example, an exhaust nozzle unit capable of moving up and down may be configured by providing a permanent magnet in a nozzle body having a gas flow path and vertically slidably holding the nozzle body with a housing provided with an electromagnet. In addition, an exhaust nozzle unit capable of moving up and down may be configured by providing a cylinder-driving mechanism driven by a fluid pressure in the side portion of a nozzle body having a gas flow path.

In addition, the exhaust nozzle unit (gas supply/exhaust device) according to the present disclosure may be configured to be retrofitted to the mounting table of the load port, and the purge nozzle unit may be changed to the exhaust nozzle unit according to the present disclosure while adopting a currently-used general load port, so that the same effects as those of the above-described embodiment can be obtained.

The fitting portion between each exhaust nozzle unit and the port of the container may be configured to be brought into a sealed state by a packing or the like provided in the exhaust nozzle unit.

In the above-described embodiment, the FOUP used for wafer transfer was adopted as a container. However, the container according to the present disclosure is not limited thereto. It may be possible to adopt an MAC (Multi-Application Carrier), a H-MAC (Horizontal-MAC), a FOSB (Front Open Shipping Box) or the like. Furthermore, the container is not limited to the wafer storage container and may be a sealed container for accommodating an object to be accommodated (transfer target object) such as an electronic component or the like to be transferred in a state of being filled with an inert gas.

In the above-described embodiment, the nitrogen gas was exemplified as the environmental gas or the nozzle control gas used for the bottom purge process, etc. However, the present disclosure is not limited thereto. It may be possible to use a desired gas (inert gas) such as a dry gas, an argon gas or the like.

Furthermore, the container door (the FOUP door 43 in the above-described embodiment) may be temporarily brought into an inclined posture in the process of moving from the closed position to the fully opened position (along with an operation of drawing a partial arc trajectory).

In addition, the specific configuration of each part or unit is not limited to the above-described embodiment and may be diversely modified without departing from the spirit of the present disclosure.

According to the present disclosure, it is possible to realize, through the use of a conventional container, a configuration in which a gas existing in a container can be discharged to the outside of the container via a port formed on the back side in the container, by connecting an exhaust nozzle unit, including a nozzle capable of switching the port from a closed state to an open state by pressing a valve of the port from below and a housing configured to hold the nozzle so as to be movable up and down between a use posture in which the port is kept in the open state and a standby posture in which the port is kept in the closed state, to a port provided on a bottom surface of the container, and then keeping the nozzle of the exhaust nozzle unit connected to the port on the back side in the container in the use posture.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An exhaust nozzle unit capable of discharging a gas atmosphere in a substrate storage container having a loading/unloading opening from the container to an outside of the container through a port formed on a bottom surface of the container, the exhaust nozzle unit comprising:
   a nozzle capable of switching the port from a closed state to an open state by pressing a check valve disposed in the port of the container, and including:
      a first nozzle capable of making close contact with an outer edge of the port; and
      a second nozzle capable of making contact with the check valve to push up the check valve; and
   a housing configured to hold the nozzle so as to be movable up and down between a use posture in which the first nozzle makes close contact with the outer edge of the port and the second nozzle makes contact with the check valve to push up the check valve such that the port is in the open state and a standby posture in which the port is in the closed state,
   wherein the first nozzle is configured to be movable up and down with respect to the housing between the use posture and the standby posture, and
   wherein the second nozzle is configured to be movable up and down with respect to the first nozzle between the use posture and the standby posture.

2. The exhaust nozzle unit of claim 1, wherein an operation adjustment space is provided between the nozzle and the housing, and the nozzle is operated between the use posture and the standby posture by taking a nozzle control gas into and out of the operation adjustment space.

3. A load port, comprising:
   a mounting table configured to mount the container; and
   the exhaust nozzle unit of claim 1 disposed at a predetermined location on the mounting table.

4. A load port, comprising:
   a mounting table configured to mount the container; and
   the exhaust nozzle unit of claim 2 disposed at a predetermined location on the mounting table.

5. An EFEM, comprising:
a transfer chamber in which a transfer robot for transferring a transfer target object between a container having a loading/unloading opening and a transfer space is disposed; and
a load port including a mounting table on which the container is mounted,
wherein the load port includes a purge device capable of replacing a gas atmosphere in the container with an environmental gas,
wherein the purge device includes at least one exhaust nozzle unit disposed at a predetermined location on the mounting table and connected to at least one port provided on a bottom surface of the container,
wherein the exhaust nozzle unit includes:
   a nozzle capable of switching the port from a closed state to an open state by pressing a check valve disposed in the port of the container, and including:
      a first nozzle capable of making close contact with an outer edge of the port; and
      a second nozzle capable of making contact with the check valve to push up the check valve; and
   a housing configured to hold the nozzle so as to be movable up and down between a use posture in which the first nozzle makes close contact with the outer edge of the port and the second nozzle makes contact with the check valve to push up the check valve such that the port is in the open state and a standby posture in which the port is in the closed state,
wherein the first nozzle is configured to be movable up and down with respect to the housing between the use posture and the standby posture, and
wherein the second nozzle is configured to be movable up and down with respect to the first nozzle between the use posture and the standby posture.

6. The EFEM of claim 5,
wherein a descending gas flow is formed in the transfer space, and the EFEM is configured to introduce the descending gas flow into the container via the loading/unloading opening.

7. An exhaust nozzle unit capable of discharging a gas atmosphere in a substrate storage container having a loading/unloading opening from the container to an outside of the container through a port formed on a bottom surface of the container, the exhaust nozzle unit comprising:
a nozzle capable of switching the port from a closed state to an open state by pressing a valve of the port, and including:
   a first nozzle capable of making close contact with an outer edge of the port; and
   a second nozzle capable of pressing the valve;
a housing configured to hold the nozzle so as to be movable up and down between a use posture in which the first nozzle makes close contact with the outer edge of the port and the second nozzle presses the valve such that the port is in the open state and a standby posture in which the port is in the closed state; and
an actuator configured to move the nozzle up and down with respect to the housing to be operated between the use posture and the standby posture,
wherein the actuator is configured with an operation adjustment space provided between the nozzle and the housing, and the nozzle is operated to move up and down between the use posture and the standby posture by taking a nozzle control gas into and out of the operation adjustment space.

* * * * *